(12) United States Patent
Wang et al.

(10) Patent No.: US 6,713,808 B2
(45) Date of Patent: Mar. 30, 2004

(54) SEMICONDUCTOR CAPACITOR WITH DIFFUSION PREVENTION LAYER

(75) Inventors: Wensheng Wang, Kawasaki (JP); Mitsushi Fujiki, Kawasaki (JP); Ko Nakamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/115,208

(22) Filed: Apr. 4, 2002

(65) Prior Publication Data

US 2003/0022454 A1 Jan. 30, 2003

(30) Foreign Application Priority Data

Jul. 13, 2001 (JP) ........................ 2001-213547
Jan. 24, 2002 (JP) ........................ 2002-016083

(51) Int. Cl.[7] .............................................. H01L 29/76
(52) U.S. Cl. ........................ 257/310; 257/295; 438/3; 438/650; 438/686
(58) Field of Search ................... 257/295, 310; 438/3, 650, 686

(56) References Cited

U.S. PATENT DOCUMENTS 5,576,928 A * 11/1996 Summerfelt et al. ..... 361/321.1
6,211,005 B1 * 4/2001 Kang ......................... 438/238
6,350,643 B1 * 2/2002 Hintermaier et al. ....... 438/240

FOREIGN PATENT DOCUMENTS

EP   0 785 579    7/1997
JP   9-22829      1/1997

* cited by examiner

Primary Examiner—Michael S. Lebentritt
Assistant Examiner—Christian D. Wilson
(74) Attorney, Agent, or Firm—Armstrong, Kratz, Quintos, Hanson & Brooks, LLP

(57) ABSTRACT

There is provided the capacitor which has the lower electrode having a structure in which the first conductive layer containing a first metal, the second conductive layer that is formed on the first conductive layer and made of the metal oxide of the second metal different from the first metal, and the third conductive layer that is formed on the second conductive layer and made of the third metal different from the first metal are formed sequentially; the dielectric layer formed on the lower electrode; and the upper electrode formed on the capacitor dielectric layer.

25 Claims, 27 Drawing Sheets

(CAPACITOR AREA 50 μm × 50 μm)

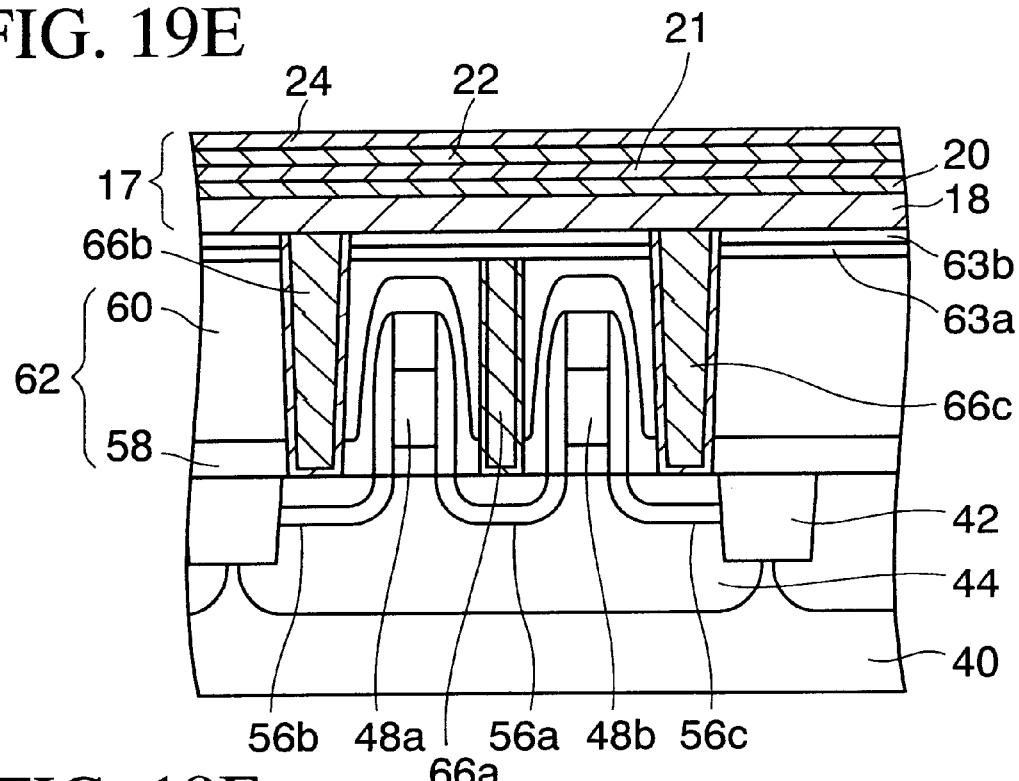
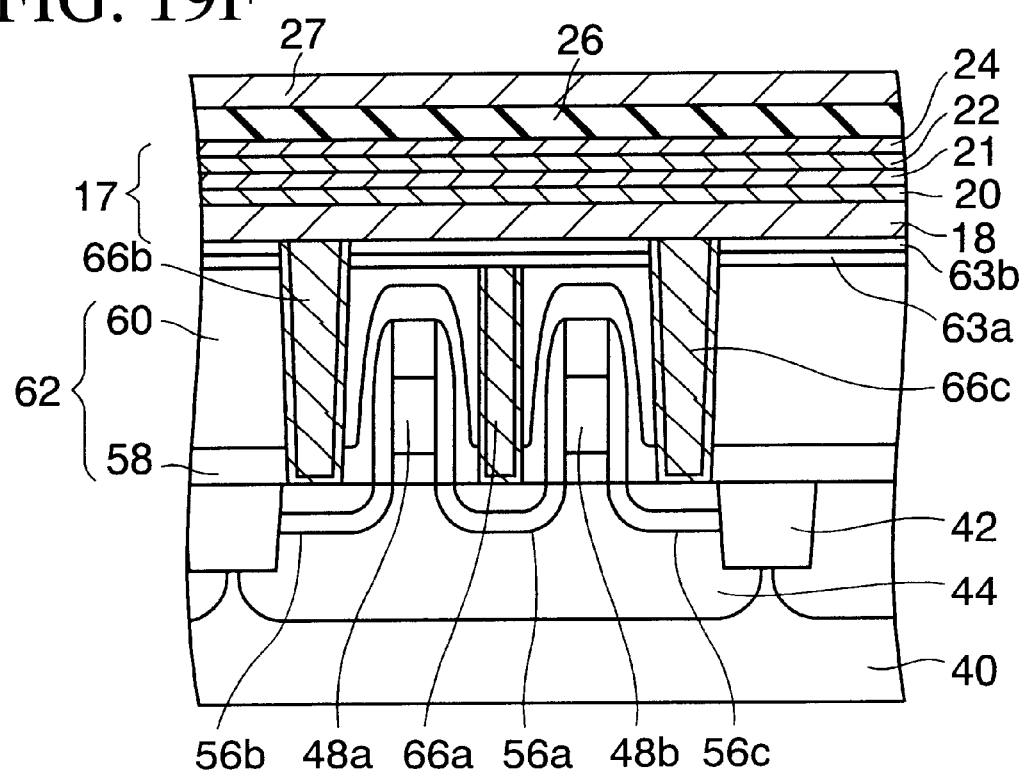

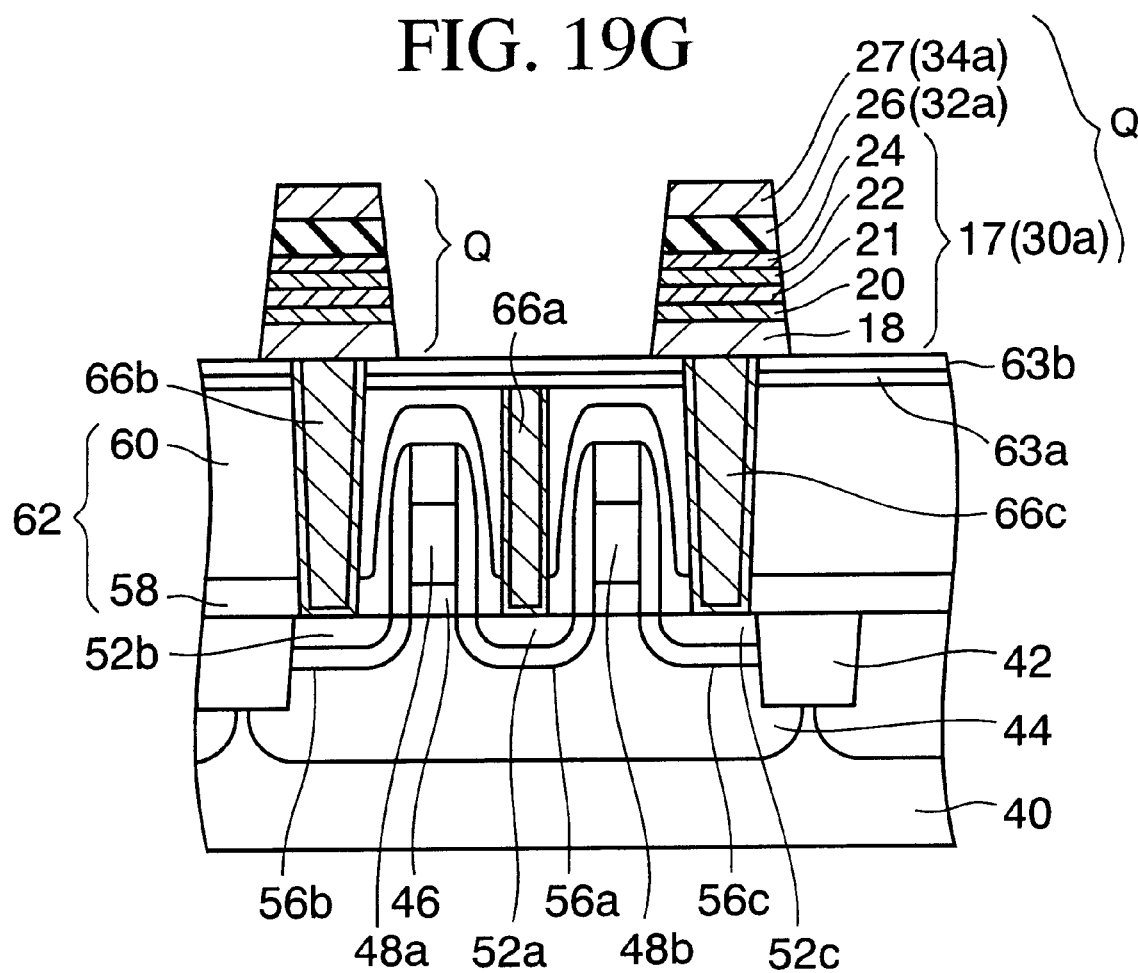

SEMICONDUCTOR CAPACITOR WITH DIFFUSION PREVENTION LAYER

CROSS-REFERENCE TO RELATED APPLICATIONS

This application is based upon and claims priority of Japanese Patent Applications No. 2002-16083, filed in Jan. 24, 2002, and No. 2001-213547, filed in Jul. 13, 2001, the contents being incorporated herein by reference.

BACKGROUND OF THE INVENTION

1. Field of the Invention

The present invention relates to a capacitor and a method of manufacturing the same and, more particularly, a capacitor having a ferroelectric layer or a high-dielectric layer and a method of manufacturing the same.

2. Description of the Prior Art

The high-dielectric layer such as the BST ($(Ba,Sr)TiO_3$) layer, the ST ($SrTiO_x$) layer, the $Ta_2O_5$ layer, etc. and the ferroelectric layer such as the PZT ($PbZr_xTi_{1-x}O_3$) layer, etc. are widely used as the capacitor dielectric layer in DRAM (Dynamic Random Access Memory), FeRAM (Ferroelectric Random Access Memory), etc. by employing positively the high dielectric constant and the inverted polarization characteristic.

Also, in the ferroelectric capacitor of FeRAM, the planar-type capacitor having the structure in which the connection between the lower electrode of the capacitor and the impurity diffusion region of the transistor is extracted from the upper side of the lower electrode is practically used. In this case, the stacked-type capacitor having the structure in which the lower electrode is connected to the impurity diffusion region via the conductive plug formed immediately under the lower electrode is required in future to reduce the cell area.

If the high-dielectric oxide layer or the ferroelectric oxide layer is used as the capacitor dielectric layer, platinum (Pt) is widely used as the electrode material. This is because the conductivity of the platinum is high, the platinum can withstand the high-temperature process in the course of formation of the dielectric layer, the platinum can control the orientation direction of the capacitor dielectric layer formed thereon, etc.

On the contrary, the platinum has the high oxygen permeability. Therefore, if the lower electrode made of the platinum is formed on the plug in the stacked-type capacitor, the oxygen can transmit through the lower electrode in the annealing process in the course of the formation of the capacitor dielectric layer to oxidize the plug. As a result, for example, if the plug is formed of tungsten, the insulating tungsten oxide layer is formed between the plug and the lower electrode and thus the contact between the plug and the lower electrode is lost.

Therefore, in the stacked-type capacitor, the stacked structure such as the Pt/Ir structure in which the Ir layer and the Pt layer are formed sequentially from the bottom, the Pt/$IrO_2$ structure in which the $IrO_2$ layer and the Pt layer are formed sequentially from the bottom, the Pt/$IrO_2$/Ir structure in which the Ir layer, the $IrO_2$ layer, and the Pt layer are formed sequentially from the bottom, or the like is employed as the lower electrode structure.

The iridium (Ir) layer and the iridium oxide ($IrO_2$) layer has the very small oxygen permeability and acts as the oxygen barrier in the annealing process. Therefore, if this layer is formed as the underlying layer of the platinum layer serving as the lower electrode of the stacked-type capacitor, the oxidation of the plug under the lower electrode can be prevented in the course of the formation of the capacitor dielectric layer.

For example, in Patent Application Publication (KOKAI) Hei 9-22829, it is proposed to use the Pt/$IrO_2$/Ir structure as the lower electrode of the ferroelectric capacitor having the stacked structure. This structure succeeds in assuring the desired characteristic of the ferroelectric layer, while suppressing the oxidation of the lower layer structure of the capacitor by the annealing process in the oxygen atmosphere.

However, in the case that the PZT layer deposited by the sputtering method is applied as the capacitor dielectric layer, it is found that, if the lower electrode structure containing the iridium-based oxygen barrier layer (Ir layer, $IrO_2$ layer) is employed, the increase in the leakage current of the capacitor is brought about.

If the PZT layer is deposited on the lower electrode by the sputtering, the as-deposited PZT layer is in the amorphous state and the high-temperature annealing process is needed to crystallize the PZT layer.

However, if the high-temperature annealing process is applied to crystallize the PZT layer after the amorphous PZT layer is deposited on the lower electrode having the structure in which the Pt layer is formed on the iridium-based oxygen barrier layer, the iridium element in the iridium-based oxygen barrier layer transmits through the Pt layer to diffuse into the PZT layer and then is introduced into the PZT crystal. As a result, the insulating property of the PZT crystal is lowered.

Such phenomenon can be avoided by growing the PZT layer that is in the crystal state on the lower electrode or crystallizing the PZT crystal at the low temperature. In this case, the dielectric constant of the formed PZT layer becomes small.

SUMMARY OF THE INVENTION

It is an object of the present invention to provide a capacitor capable of preventing the oxidation of the conductive plug formed immediately under the lower electrode and also preventing the metallic diffusion from the lower electrode to the capacitor dielectric layer in the course of the formation and the crystallization of the capacitor dielectric layer, and a method of manufacturing the same.

The above subject can be overcome by providing a capacitor which comprises a lower electrode having a structure in which a first conductive layer containing a first metal, a second conductive layer that is formed on the first conductive layer and made of a metal oxide of a second metal different from the first metal, and a third conductive layer that is formed on the second conductive layer and made of a third metal different from the first metal are formed sequentially; a dielectric layer formed on the lower electrode; and an upper electrode formed on the capacitor dielectric layer.

In the above capacitor, the first metal is iridium, the metal oxide of the second metal is a metal oxide of a platinum group metal except the iridium, and the third metal is the platinum group metal except the iridium.

In the above capacitor, the second metal is a same element as the third metal, and an interface conductive layer made of the second metal is further formed between the first conductive layer and the second conductive layer.

The above subject can be overcome by providing a capacitor manufacturing method which comprises the steps of forming a first conductive layer containing a first metal on an insulating layer; forming a second conductive layer made of a metal oxide of a second metal, that is different from the first metal, on the first conductive layer; forming a third conductive layer made of a third metal, that is different from the first metal, on the second conductive layer; forming a dielectric layer on a lower electrode; forming a fourth conductive layer on the dielectric layer; patterning the first conductive layer, the second conductive layer, and the third conductive layer to form a capacitor lower electrode; patterning the dielectric layer to form a capacitor dielectric layer; and patterning the fourth conductive layer to form a capacitor upper electrode.

In the capacitor manufacturing method, the second metal is a same element as the third metal, and the capacitor manufacturing method further comprises the step of forming an interface conductive layer made of the second metal between the first conductive layer and the second conductive layer.

According to the present invention, the capacitor is constructed by the lower electrode having the first conductive layer in which the first metal (e.g., iridium) is contained, the second conductive layer which is formed on the first conductive layer and made of the metal oxide of the second metal (e.g., the platinum group except the iridium), and the third conductive layer which is formed on the second conductive layer and made of the third metal (e.g., the metal of the platinum group except the iridium), the capacitor dielectric layer formed on the lower electrode, and the upper electrode formed on the capacitor dielectric layer.

According to the structure of such lower electrode, the diffusion of the oxygen into the conductive plug formed immediately under the lower electrode in the course of the layer formation of the capacitor dielectric layer can be prevented by the first conductive layer, and also the diffusion of the first metal from the first conductive layer to the capacitor dielectric layer can be prevented by the second conductive layer.

Therefore, the electric connection between the conductive plug and the lower electrode can be improved, and also the sufficient crystallization of the capacitor dielectric layer can be achieved while preventing the diffusion of the first metal into the dielectric layer after the dielectric layer is formed on the lower electrode. As a result, the high performance capacitor having the desired electric characteristics can be manufactured.

In addition, according to the present invention, the interface conductive layer made of the second metal, e.g., the metal of the platinum group except the iridium, is formed between the first conductive layer and the second conductive layer. Therefore, the (111) intensities of the third conductive layer and the ferroelectric layer can be enhanced and thus the electric characteristics of the ferroelectric capacitor can be improved.

BRIEF DESCRIPTION OF THE DRAWINGS

FIGS. 9A to 9J, and FIGS. 11A to 11C are sectional views showing steps in a method of manufacturing the semiconductor device according to the second embodiment of the present invention;

FIGS. 19A to 19K are sectional views showing steps of manufacturing a semiconductor device according to a fifth embodiment of the present invention.

DETAILED DESCRIPTION OF THE PREFERRED EMBODIMENTS

Embodiments of the present invention will be explained with reference to the accompanying drawings hereinafter.
First Embodiment A semiconductor device having a capacitor according to a first embodiment of the present invention and a method of manufacturing the same will be explained with reference to FIG. 1 to FIG. 7 hereunder.

Figure 1:
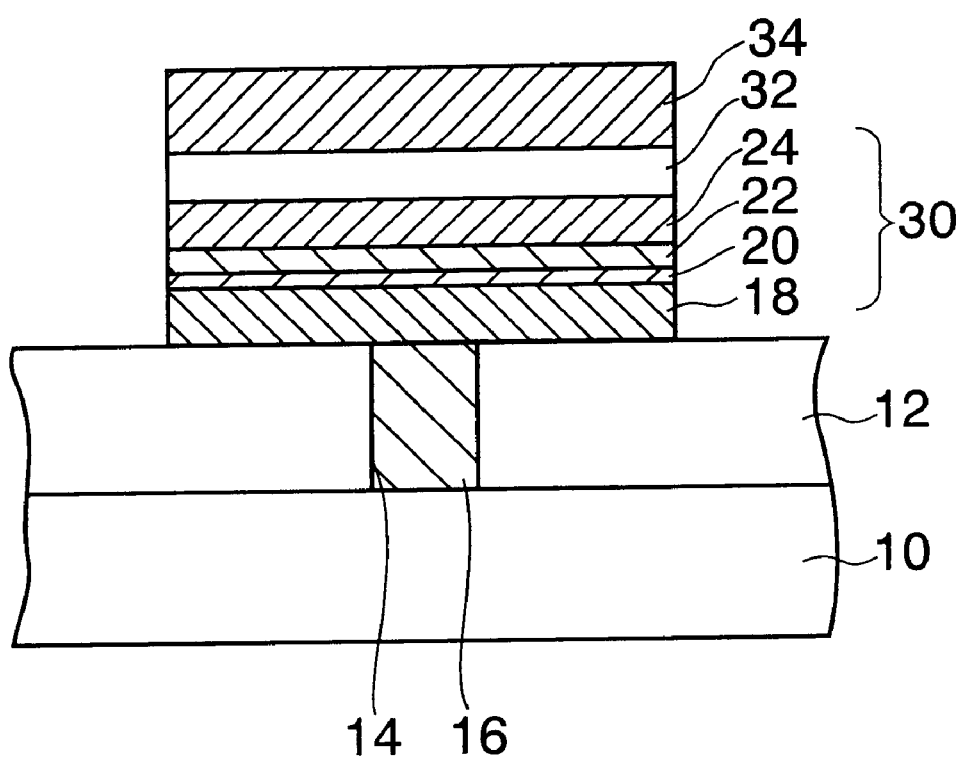
FIG. 1 is a schematic sectional view showing a structure of a capacitor according to a first embodiment of the present invention.
Figure 2:
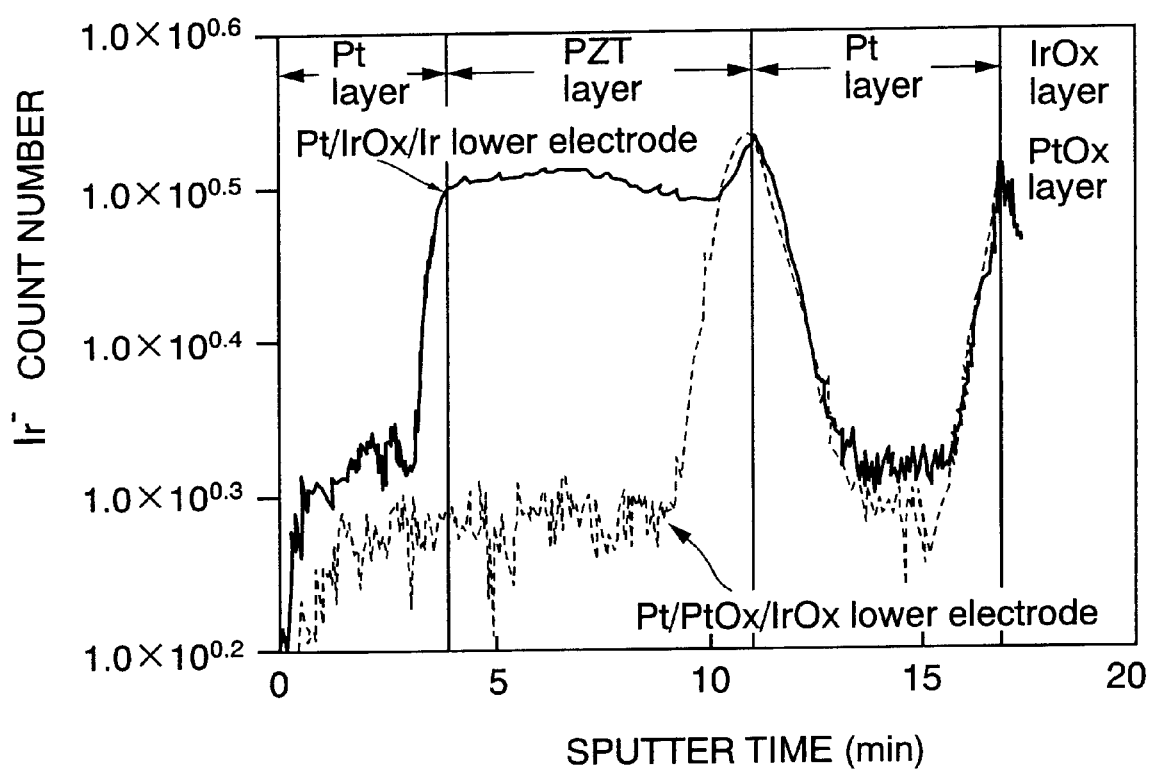
FIG. 2 is a graph showing the diffusion of iridium in the capacitor and the diffusion preventing effect.
Figure 3A:
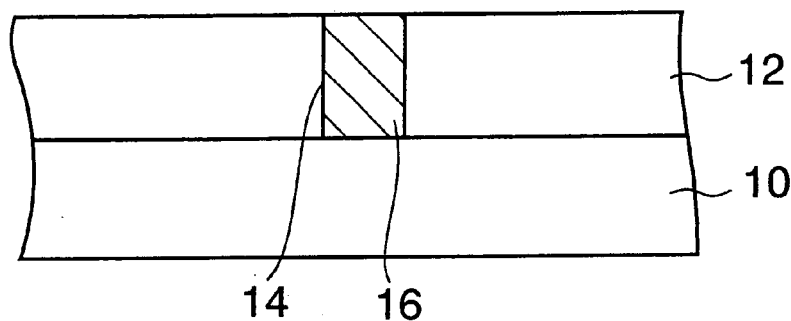
FIGS. 3A to 3C are sectional views showing steps in a method of manufacturing the capacitor according to the first embodiment of the present invention.
Figure 3B:
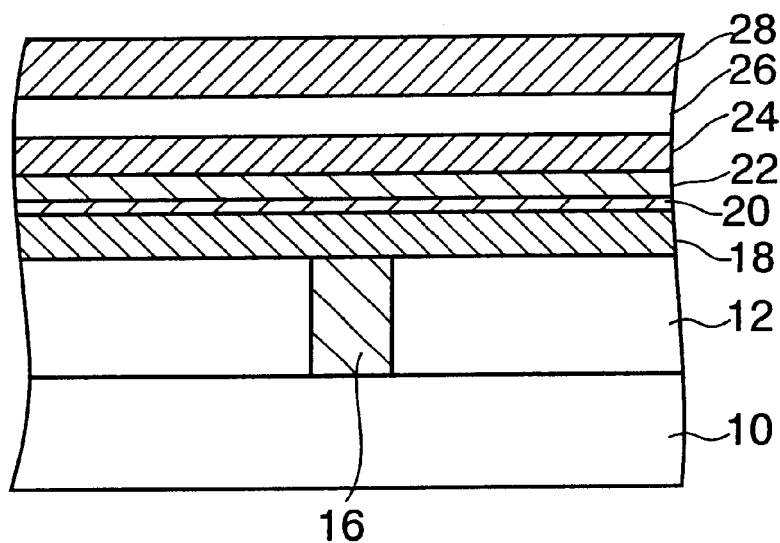
Figure 3C:
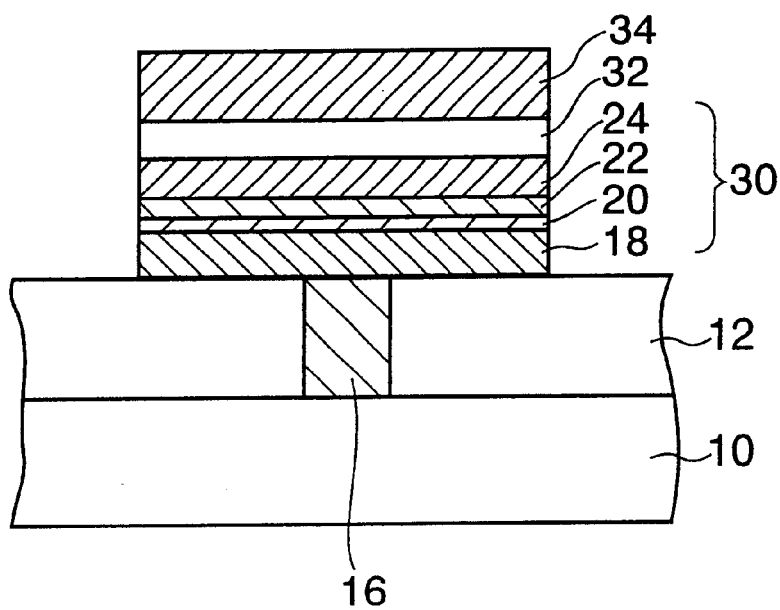
Figure 4:
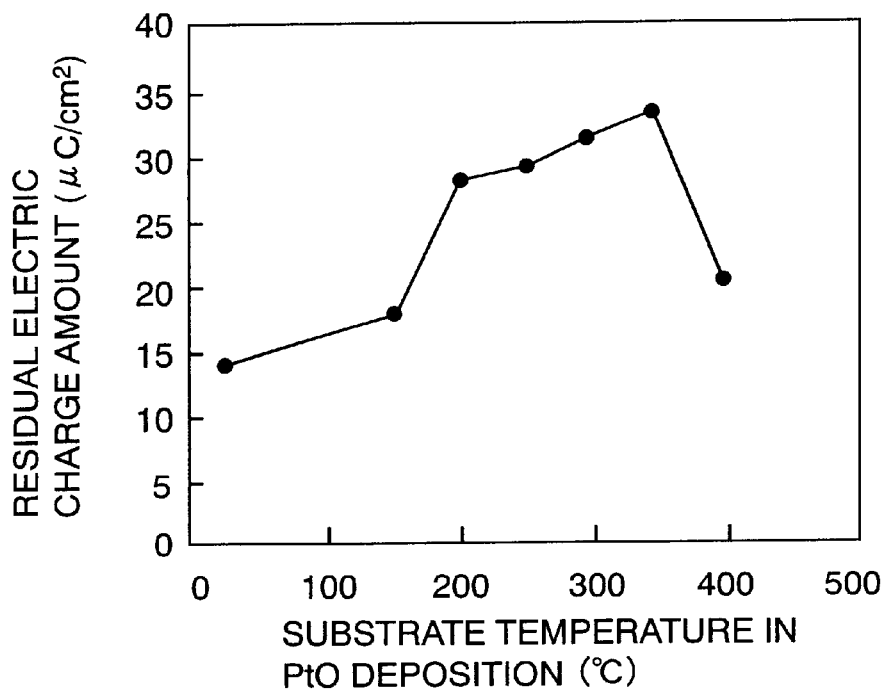
FIG. 4 is a graph showing the dependency of the residual electric charge amount on the substrate temperature in the capacitor according to the first embodiment of the present invention.
Figure 5:
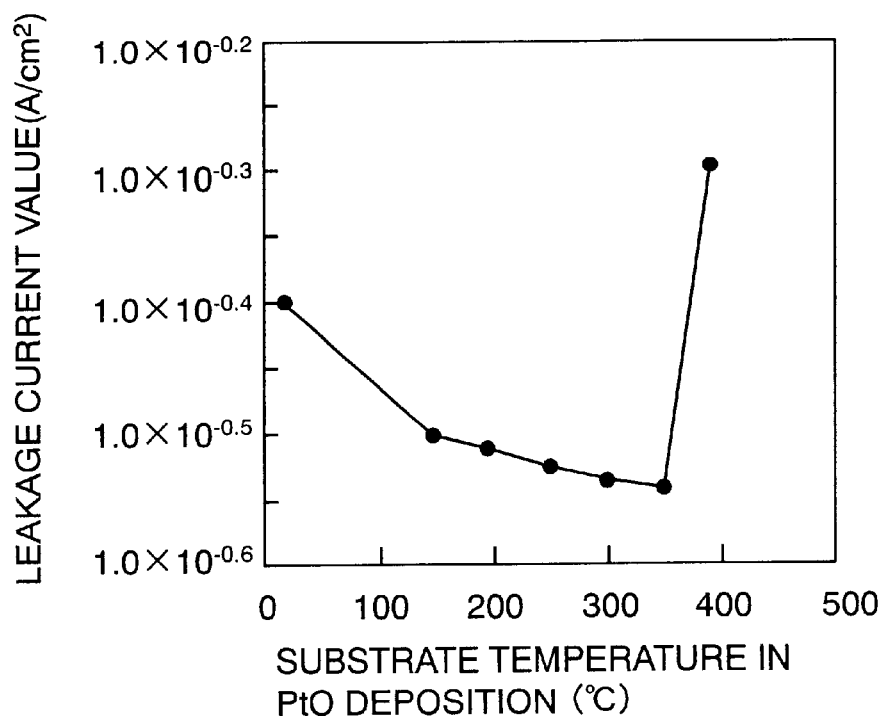
FIG. 5 is a graph showing the dependency of the leakage current on the substrate temperature in the capacitor according to the first embodiment of the present invention.
Figure 6:
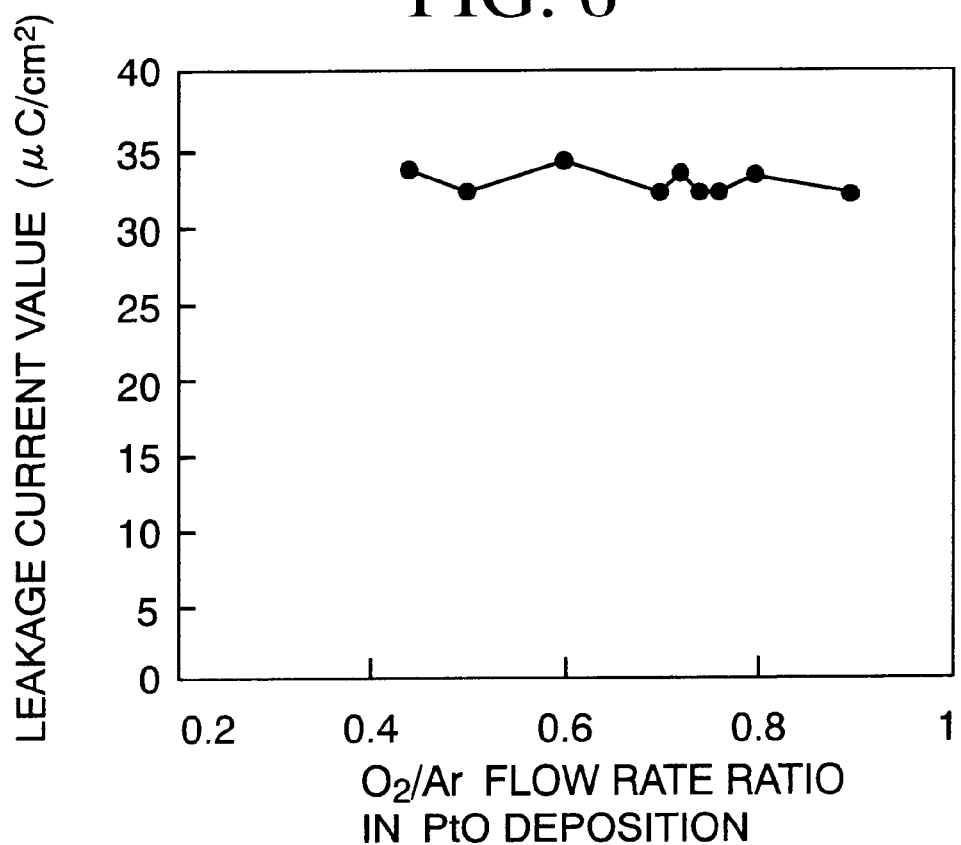
FIG. 6 is a graph showing the dependency of the residual electric charge amount on the gas flow rate ratio in the capacitor according to the first embodiment of the present invention.
Figure 7:
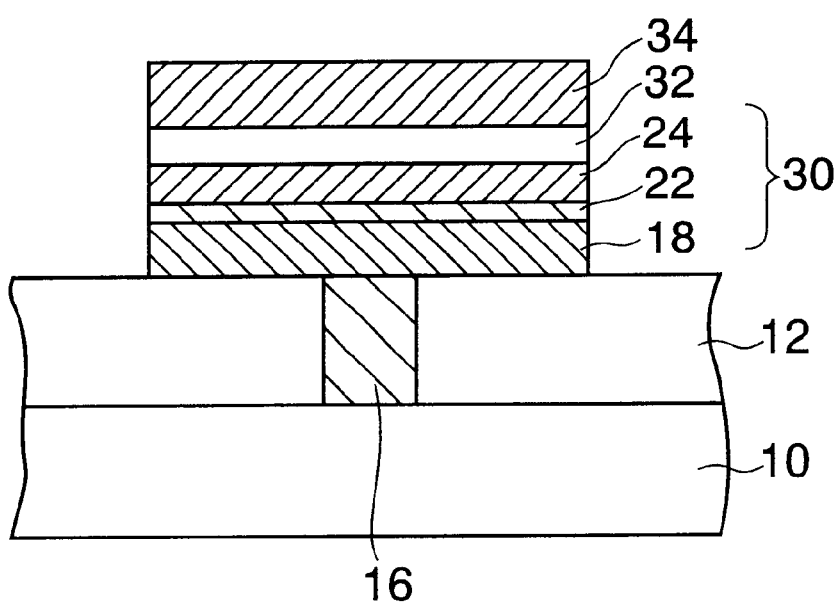
FIG. 7 is a schematic sectional view showing a structure of a capacitor according to a variation of the first embodiment of the present invention.

FIG. 1 is a schematic sectional view showing a structure of a capacitor according to a first embodiment. FIG. 2 is a graph showing the diffusion of iridium in the capacitor and the diffusion preventing effect. FIGS. 3A to 3C are sectional views showing steps in a method of manufacturing the capacitor according to the first embodiment. FIG. 4 is a graph showing the dependency of the residual electric charge amount on the substrate temperature in the capacitor according to the first embodiment. FIG. 5 is a graph showing the dependency of the leakage current on the substrate temperature in the capacitor according to the first embodiment. FIG. 6 is a graph showing the dependency of the residual electric charge amount on the gas flow rate ratio in the capacitor according to the first embodiment. FIG. 7 is a schematic sectional view showing a structure of a capacitor according to a variation of the first embodiment.

First, a structure of the capacitor according to the first embodiment will be explained with reference to FIG. 1 hereunder.

An interlayer insulating layer 12 is formed on a silicon substrate 10. A contact hole 14 that reaches the silicon substrate 10 is formed in the interlayer insulating layer 12. A conductive plug 16 that is connected electrically to the silicon substrate 10 is formed in the contact hole 14. The capacitor having a lower electrode 30 that is formed by stacking an iridium layer 18, an iridium oxide layer 20, a platinum oxide layer 22, and a platinum layer 24 sequentially, a capacitor dielectric layer 32 that is formed of the PZT layer formed on the lower electrode 30, and an upper electrode 34 that is formed of the platinum layer formed on the capacitor dielectric layer 32 is formed on the interlayer insulating layer 12 in which the plug 16 is buried.

In this manner, the main feature of the capacitor according to the first embodiment resides in that the lower electrode 30 is formed of the stacked layer consisting of the iridium layer 18, the iridium oxide layer 20, the platinum oxide layer 22, and the platinum layer 24. The reason for the structure that the lower electrode 30 is constructed by such stacked structure in the capacitor according to the first embodiment will be explained hereunder.

The iridium layer 18 and the iridium oxide layer 20 are layers serving as the oxygen barrier. As described above, the platinum layer 24 is the layer having the high oxygen permeability. Thus, unless the oxygen barrier layer is provided under the platinum layer 24, the oxygen is diffused toward the plug 16 in the course of the layer formation of the capacitor dielectric layer 32 or in the course of the crystallization thereof and thus at least an upper surface of the plug 16 is oxidized. If the iridium layer 18 and the iridium oxide layer 20, both having the low oxygen permeability, are provided between the plug 16 and the platinum layer 24, the plug 16 is never oxidized in the course of the layer formation of the capacitor dielectric layer 32 or in the course of the crystallization thereof. Thus, the contact characteristic between the plug 16 and the lower electrode 30 can be held satisfactorily.

The reason for forming the iridium oxide layer 20 in addition to the iridium layer 18 is to provide the sufficient orientation to the platinum layer 24 formed thereon. The platinum layer 24 can be oriented only by the iridium layer 18, but the orientation of the iridium layer 18 is reflected on the platinum layer 24. In order to give the sufficient orientation to the platinum layer 24 much more, it is desired that the iridium oxide layer 20 should be formed in addition to the iridium layer 18.

The platinum oxide layer 22 is the iridium diffusion preventing layer that prevents the diffusion of the iridium from the oxygen barrier layer (the iridium layer 18 and the iridium oxide layer 20) to the capacitor dielectric layer 32. As described above, if the PZT layer deposited by the sputter method is applied as the capacitor dielectric layer 32, the iridium is diffused into the PZT layer from the iridium-based oxygen barrier layer via the Pt layer and thus the leakage current of the capacitor is increased. Therefore, if the platinum oxide layer 22 that has the high iridium diffusion preventing capability is formed on the oxygen barrier layer, the iridium can be prevented from being diffused into the PZT layer in the course of the annealing process as the post process. As a result, the crystallization of the capacitor dielectric layer 32 can be achieved sufficiently and thus the capacitor dielectric layer 32 having the desired dielectric constant can be formed.

FIG. 2 is a graph showing results of the iridium distribution in the capacitor in the depth direction, which are measured by the secondary ion mass spectrometry method. In FIG. 2, a dotted line indicates the case where the electrode structure of the capacitor according to the first embodiment is employed, and a solid line indicates the case where the Pt/IrO$_x$/Ir electrode structure in the prior art is employed. As shown in FIG. 2, the iridium is seldom watched in the PZT layer in the capacitor according to the first embodiment indicated by the dotted line, but the iridium is watched at the high concentration in the capacitor having the Pt/IrO$_x$/Ir electrode structure indicated by the solid line. It can be understood from FIG. 2 that the platinum oxide layer 22 that is provided between the platinum layer 24 and the iridium oxide layer 20 of the lower electrode 30 has the iridium diffusion preventing action.

In this case, the mechanism for preventing the diffusion of the iridium by the platinum oxide layer 22 is not apparent. But it may be considered that the oxygen contained in the platinum oxide layer 22 has the important role to prevent the diffusion of the iridium.

The platinum layer 24 is the layer that is provided mainly to control the orientation of the crystal of the capacitor dielectric layer 32. The platinum layer 24 has the high conductivity and is effective for the reduction in the resistance of the lower electrode 30. Also, there is the merit such that the platinum layer 24 has the high melting point and can withstand the high-temperature process in the course of the formation of the capacitor dielectric layer.

If the capacitor is constructed in this manner, the iridium layer 18 functions as the oxygen barrier and the platinum oxide layer 22 functions as the diffusion barrier of the iridium. For this reason, the entering of the oxygen in the course of the formation of the capacitor dielectric layer 32 and the diffusion of the iridium into the capacitor dielectric layer 32 can be prevented. Therefore, the capacitor dielectric layer 32 having the desired dielectric constant can be formed, while maintaining the contact characteristic between the plug 16 and the lower electrode 30.

The characteristics of the capacitor due to difference in the structures in the first embodiment and the prior art are shown in Table 1. By way of comparison, the characteristic of the capacitor having the lower electrode that has the Pt/IrO$_x$/Ir structure, in which the iridium diffusion preventing layer is not provided, and the characteristic of the capacitor having the lower electrode that has the Pt/Ti structure, which is widely employed in the planar-type capacitor, are also shown in Table 1. In this case, the residual electric charge amount is measured at 3 V and the leakage current is measured at 6 V.

TABLE 1

| (A) | (B) | (C) | (D) |
|---|---|---|---|
| Pt/PtO$_x$/IrO$_x$/Ir | 33.0 | 2.9 | 3.4 × 10$^{-6}$ |
| Pt/IrO$_x$/Ir | 35.0 | 4.5 | 4.0 × 10$^{-2}$ |
| Pt/Ti | 35.0 | 3.0 | 3.6 × 10$^{-6}$ |

(A): Lower electrode structure
(B): Residual electric charge amount [μC/cm$^2$]
(C): Polarization saturation voltage [V]
(D): Leakage current [A/cm$^2$]

As shown in Table 1, the leakage current becomes in the order of μA/cm$^2$ in the capacitor according to the first embodiment. In contrast, in the capacitor that has the lower electrode having the Pt/IrO$_x$/Ir structure in the prior art, it can be understood that the leakage current is larger than the capacitor according to the first embodiment by about four figures and that the layer quality of the capacitor dielectric layer is degraded by the diffusion of the iridium. Also, respective characteristics of the capacitor according to the first embodiment are by no means inferior to the capacitor that has the lower electrode having the Pt/Ti structure and are satisfactory.

Next, a method of manufacturing the capacitor according to the first embodiment will be explained with reference to FIGS. 3A to 3C hereunder.

First, steps required until the structure shown in FIG. 3A is formed will be explained hereunder.

The interlayer insulating layer 12 made of the silicon oxide layer is formed by depositing the silicon oxide layer of 700 nm thickness, for example, on the silicon substrate 10 by the CVD method, for example.

Then, the contact hole that reaches the silicon substrate 10 is formed in the interlayer insulating layer 12 by the lithography and the dry etching.

Then, a titanium (Ti) layer of 20 nm thickness, a titanium nitride (TiN) layer of 10 nm thickness, and a tungsten (W) layer of 300 nm thickness, for example, are deposited on the overall surface by the CVD method, for example.

Then, the plug 16 that consists of the stacked structure of the W/TiN/Ti structure and is buried in the contact hole 14 is formed by polishing flat the tungsten layer, the titanium nitride layer, and the titanium layer by virtue of the CMP (Chemical Mechanical Polishing) method, for example, until a surface of the interlayer insulating layer 12 is exposed (FIG. 3A).

Next, steps required until the structure shown in FIG. 3B is formed will be explained.

The iridium layer 18 of 200 nm thickness, for example, is formed on the overall surface of the interlayer insulating layer 12 and the plug 16 by the sputter method, for example. For instance, the iridium layer 18 of 200 nm thickness is formed by growing the layer for 144 seconds at the substrate temperature of 200° C., the power of 1 kW, and the argon (Ar) gas flow rate of 100 sccm.

Then, the iridium oxide layer 20 of 30 nm thickness, for example, is formed on the iridium layer 18 by the sputter method, for example. For instance, the iridium oxide layer 20 of 30 nm thickness is formed by growing the layer for 11 seconds at the substrate temperature of 20° C., the power of 1 kW, the argon gas flow rate of 25 sccm, and the oxygen gas flow rate of 25 sccm.

Then, the platinum oxide layer 22 of 23 nm thickness, for example, is formed on the iridium oxide layer 20 by the sputter method, for example. For instance, the platinum oxide layer 22 of 23 nm thickness is formed by growing the layer for 27 seconds at the substrate temperature of 350° C., the power of 1 kW, the argon gas flow rate of 36 sccm, and the oxygen gas flow rate of 144 sccm.

As shown in FIG. 4, when the substrate temperature in forming the platinum oxide layer 22 is lower than 200° C. or higher than 400° C., the reduction in the residual electric charge amount appears. Also, as shown in FIG. 5, the substrate temperature in forming the platinum oxide layer 22 is lower than 200° C. or higher than 400° C., the leakage current is increased. Also, the oxygen is dissociated during the layer formation of the platinum oxide layer 22 at the substrate temperature of more than 400° C., so that the platinum layer is formed. Accordingly, it is desired that the substrate temperature in forming the platinum oxide layer 22 should be set over 200° C. and below 400° C. Also, the residual electric charge amount has the larger value if the layer forming temperature becomes higher within the above temperature range. Therefore, it is desired that the substrate temperature in forming the platinum oxide layer 22 should be set to the higher temperature within the above temperature range, e.g., the temperature of about 350° C.

In addition, the layer thickness of the platinum oxide layer 22 is set to 23 nm in the above layer forming conditions, but the layer thickness of more than 15 nm may be appropriately selected. The adhesiveness of the platinum oxide layer 22 is not sufficient if the layer thickness is thinner than 15 nm, while the subsequent workability is degraded if the layer thickness is too thick. As a result, it is desired that the layer thickness of the platinum oxide layer 22 should be appropriately selected in response to the structure of the applied system and process to exceed the layer thickness of 15 nm.

Also, in the above layer forming conditions, the gas flow rate ratio in forming the platinum oxide layer 22 is set as Ar:O$_2$=1:4. As shown in FIG. 6, if the gas flow rate ratio is changed in the range of Ar:O$_2$=7:2 to 1:9 (oxygen concentration 40 to 90%), the residual electric charge amount in the formed capacitor is seldom changed. In other words, it may be considered that the gas flow rate ratio in forming the platinum oxide layer 22 does not exert a bad influence upon the residual electric charge amount. According to this, the gas flow rate ratio in forming the platinum oxide layer 22 may be set to any value, and preferably the oxygen concentration should be set to 40 to 80%.

Then, the platinum layer 24 of 100 nm thickness, for example, is formed on the platinum oxide layer 22 by the sputter method, for example. For instance, the platinum layer 24 of 100 nm thickness is formed by growing the layer for 54 seconds at the substrate temperature of 13° C., the power of 1 kW, and the argon gas flow rate of 100 sccm.

In this case, the substrate temperature in forming the platinum layer 24 is set below 400° C. This is because the oxygen is dissociated from the underlying platinum oxide layer 22 if the layer is formed at the temperature of more than 400° C. and thus the iridium diffusion preventing action is degraded.

Then, the rapid thermal annealing process is carried out at 600 to 750° C. in the argon atmosphere to crystallize the platinum layer 24. Since the platinum layer 24 has the predetermined orientation by this annealing process, it is possible to control the orientation of the PZT layer to be formed later.

Then, a PZT layer 26 of 100 nm thickness, for example, is formed on the platinum layer 24 by the sputter method.

Then, the PZT layer 26 is crystallized by executing the rapid thermal annealing process at 750° C. in the oxygen atmosphere. At this time, the PZT layer 26 is subjected to the orientation of the underlying platinum layer 24 and then oriented in (111). Also, since the platinum oxide layer 22 that functions as the iridium diffusion barrier layer is formed between the PZT layer 26 and the iridium oxide layer 20, the iridium is in no ways diffused into the PZT layer 26 even if such high-temperature process is carried out.

Then, a platinum layer 28 of 100 nm thickness, for example, is formed on the PZT layer 26 by the sputter method, for example. For instance, the platinum layer 28 of 100 nm thickness is formed by growing the layer for 54 seconds at the substrate temperature of 13° C., the power of 1 kW, and the argon gas flow rate of 100 sccm (FIG. 3B).

Then, the lower electrode 30 consisting of the platinum layer 24/the platinum oxide layer 22/the iridium oxide layer 20/the iridium layer 18, the capacitor dielectric layer 32 formed on the lower electrode 30 and consisting of the PZT layer, the upper electrode 34 formed on the capacitor dielectric layer 32 and consisting of the platinum layer are formed by patterning the platinum layer 28, the PZT layer 26, the platinum layer 24, the platinum oxide layer 22, the iridium oxide layer 20, and the iridium layer 18 into the same shape by virtue of the lithography and the dry etching (FIG. 3C).

In this fashion, the capacitor having the lower electrode 30 consisting of the platinum layer 24/the platinum oxide layer 22/the iridium oxide layer 20/the iridium layer 18 can be formed.

As described above, according the first embodiment, the lower electrode 30 consisting of the platinum layer 24/the platinum oxide layer 22/the iridium oxide layer 20/the iridium layer 18 is formed. Thus, the diffusion of the oxygen in the course of the layer formation of the capacitor dielectric layer 32 can be prevented by the iridium oxide layer 20 and the iridium layer 18, and also the diffusion of the iridium from the oxygen diffusion barrier layer to the capacitor dielectric layer 32 can be prevented by the platinum oxide layer 22. Therefore, even if the capacitor dielectric layer 32 is formed by the sputtering, the sufficient crystallization of the capacitor dielectric layer can be achieved while preventing the diffusion of the iridium. As a result, the high-performance ferroelectric capacitor having the desired electric characteristics can be manufactured.

In the above first embodiment, the lower electrode 30 is formed of the stacked layer that consists of the iridium layer 18, the iridium oxide layer 20, the platinum oxide layer 22, and the platinum layer 24. Either the iridium layer 18 or the iridium oxide layer 20 may be employed as the layer that is used as the oxygen barrier. For example, as shown in FIG. 7, the lower electrode 30 may be formed of the stacked layer that consists of the iridium layer 18, the platinum oxide layer 22, and the platinum layer 24.

Second Embodiment

A semiconductor device and a method of manufacturing the same according to a second embodiment of the present invention will be explained with reference to FIG. 8 to FIGS. 11A to 11C hereunder.

Figure 8:
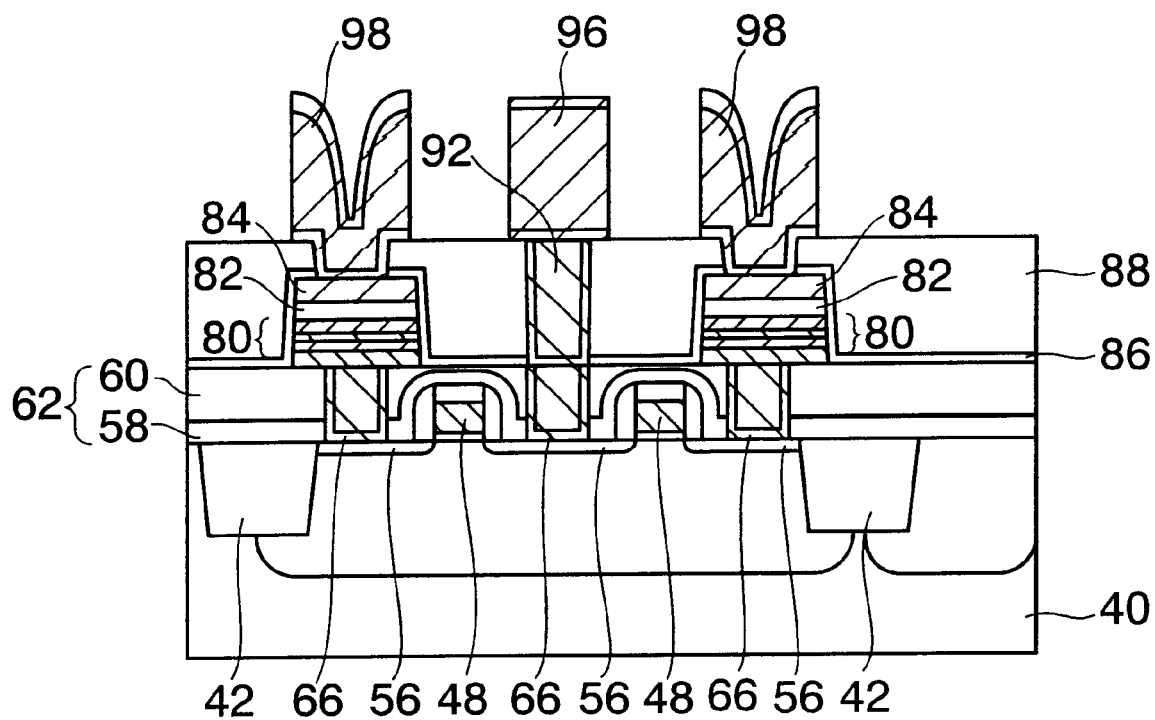
FIG. 8 is a schematic sectional view showing a structure of a semiconductor device according to a second embodiment of the present invention.

FIG. 8 is a schematic sectional view showing a structure of a semiconductor device according to a second embodiment. FIGS. 9A to 9D, FIGS. 10A to 10C, and FIGS. 11A to 11C are sectional views showing steps in a method of manufacturing the semiconductor device according to the second embodiment.

First of all, the structure of the semiconductor device according to the second embodiment will be explained with reference to FIG. 8 hereunder.

An element isolation layer 42 is formed on a silicon substrate 40. Memory cell transistors having gate electrodes 48 and source/drain diffusion layers 56 are formed in an element region that is defined by the element isolation layer 42. An interlayer insulating layer 62 is formed on the silicon substrate 40 on which the memory cell transistors are formed. Plugs 66 that are electrically connected to the source/drain diffusion layers 56 are buried in the interlayer insulating layer 62.

Lower electrodes 80 having the Pt/PtO$_x$/IrO$_x$/Ir structure is formed on the interlayer insulating layer 62 in which the plugs 66 are buried. Capacitor dielectric layers 82 made of PZT are formed on the lower electrodes 80 respectively. Upper electrodes 84 made of iridium oxide are formed on the capacitor dielectric layers 82 respectively. In this manner, the ferroelectric capacitor is constructed by the lower electrode 80, the capacitor dielectric layer 82, and the upper electrode 84.

A ferroelectric capacitor protection layer 86 and an interlayer insulating layer 88 are formed on the interlayer insulating layer 62 on which the ferroelectric capacitors are formed. A plug 92 that is connected electrically to the plugs 66 is buried in the interlayer insulating layer 88 and the ferroelectric capacitor protection layer 86. A wiring layer 96 that is connected electrically to the source/drain diffusion layers 56 via the plugs 92, 66 and wiring layers 98 that are connected electrically to the upper electrodes 84 are formed on the interlayer insulating layer 88 in which the plug 92 is buried.

In this way, the feature of the semiconductor device according to the second embodiment is that the capacitor lower electrode 80 of the ferroelectric memory is constructed by the Pt/PtO$_x$/IrO$_x$/Ir structure like the lower electrode structure of the capacitor according to the first embodiment. If the ferroelectric memory is constructed in this manner, the diffusion of the oxygen in the middle of the layer formation of the capacitor dielectric layer can be prevented by the iridium oxide layer and the iridium layer and also the diffusion of the iridium from the oxygen diffusion barrier layer to the capacitor dielectric layer can be prevented by the platinum oxide layer. Accordingly, if the capacitor dielectric layer is formed by the sputtering, the sufficient crystallization of the capacitor dielectric layer can be achieved with preventing the diffusion of the iridium. As a result, the high performance ferroelectric memory having the desired electric characteristics can be manufactured.

Next, a method of manufacturing the semiconductor device according to the second embodiment will be explained with reference to FIGS. 9A to 9D to FIGS. 11A to 11C hereunder.

First, the element isolation layer 42 that is buried in the silicon substrate 40 is formed on the silicon substrate 40 by the shallow trench method, for example.

Figure 9A:
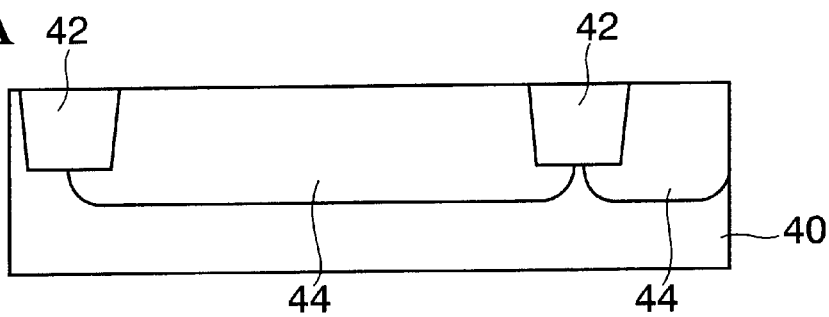

Then, a P-well 44 is formed by ion-implanting the boron ion, for example, into a memory cell forming region (FIG. 9A).

Then, a gate insulating layer 46 made of a silicon oxide layer is formed on an element region defined by the element isolation layer 42 by oxidizing a surface of the silicon substrate 40 by means of the thermal oxidation method, for example.

Then, a polysilicon layer and a silicon nitride layer are deposited on the gate insulating layer 46 by the CVD method, for example.

Then, the gate electrodes 48, upper surfaces of which are covered with a silicon nitride layer 50 and which are formed of the polysilicon layer, are formed by patterning the silicon nitride layer and the polysilicon layer into the same shape.

Figure 9B:
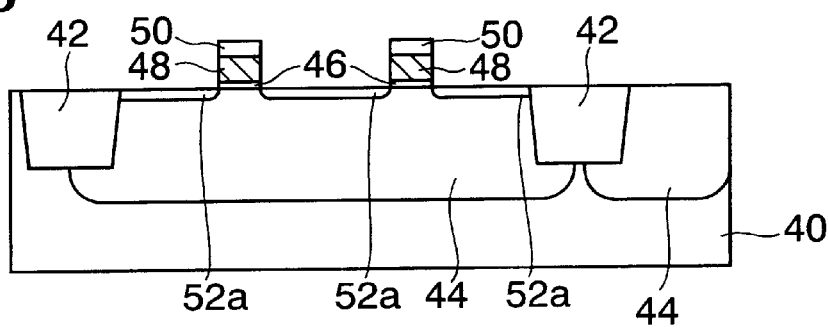

Then, impurity diffusion regions 52 are formed on the silicon substrate 40 on both sides of the gate electrodes 48 by implanting the ion into the silicon substrate 40 while using the gate electrodes 48 as a mask (FIG. 9B).

Next, a silicon nitride layer is deposited on the overall surface by the CVD method, for example. Then, sidewall insulating layers 54 made of the silicon nitride layer are formed on side walls of the gate electrodes 48 and the silicon nitride layer 50 by etching back the silicon nitride layer.

Figure 9C:
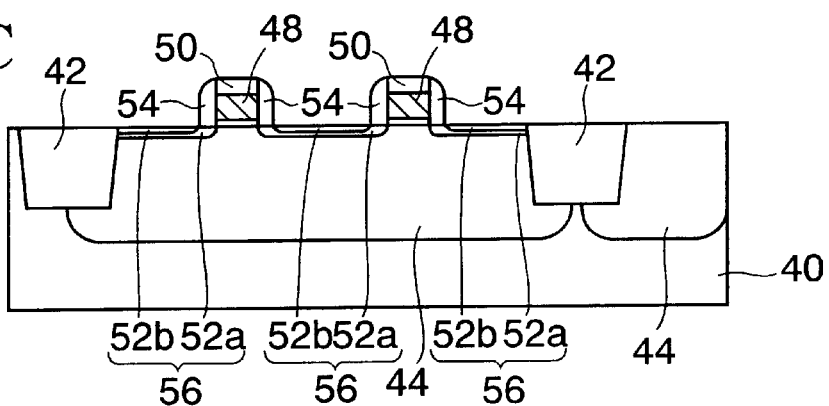

Then, impurity diffusion regions 52b are formed on the silicon substrate 40 on both sides of the gate electrodes 48 by implanting the ion into the silicon substrate 40 while using the gate electrodes 48 and the sidewall insulating layers 54 as a mask. Accordingly, source/drain diffusion layers 56 consisting of the impurity diffusion regions 52a, 52b are formed (FIG. 9C).

In this manner, memory cell transistors having the gate electrodes 48 and the source/drain diffusion layers 56 are formed.

Then, a silicon nitride layer 58 of 20 nm thickness and a silicon oxide layer 60 of 700 nm thickness are deposited on the silicon substrate 40, on which the memory cell transistors are formed, by the CVD method, for example.

Then, the interlayer insulating layer 62, which are made of the silicon nitride layer 58 and the silicon oxide layer 60 and a surface of which is made flat, is formed by planarizing a surface of the silicon oxide layer 60 by virtue of the CMP method, for example.

Then, contact holes 64 reaching the silicon substrate 40 are formed in the interlayer insulating layer 62 by the lithography and the dry etching.

Then, the titanium layer of 20 nm thickness, the titanium nitride layer of 10 nm thickness, and the tungsten layer of 300 nm thickness, for example, are deposited on the overall surface by the CVD method, for example.

Figure 9D:
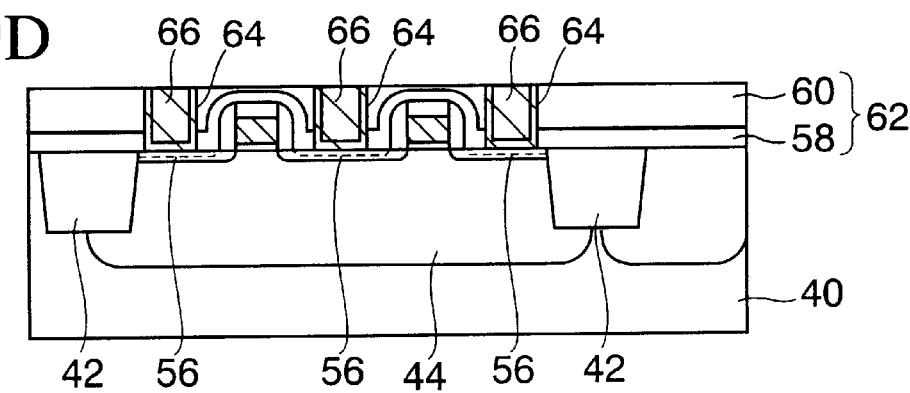

Then, the plugs 66 which have the stacked structure of the W/TiN/Ti structure and which are buried in the contact holes 64 are formed by polishing flat the tungsten layer, the titanium nitride layer, and the titanium layer until the surface of the interlayer insulating layer 62 is exposed by means of the CMP method, for example (FIG. 9D).

Next, like the lower electrode forming method in the capacitor manufacturing method according to the first embodiment, an iridium layer 68 of 200 nm thickness, an iridium oxide layer 70 of 30 nm thickness, a platinum oxide layer 72 of 23 nm thickness, and a platinum layer 74 of 100 nm thickness, for example, are formed by the sputter method, for example.

Then, the platinum layer 74 is crystallized by executing the rapid thermal annealing process at 750° C. in the argon atmosphere.

Then, a PZT layer 76 of 200 nm thickness, for example, is formed on the platinum layer 74 by the sputter method. The PZT layer 76 of 200 nm thickness is formed by growing the layer for 360 seconds at the substrate temperature of 13° C., the power of 1 kW, and the argon gas flow rate of 24 sccm, for example.

Then, the PZT layer 76 is crystallized by executing the rapid thermal annealing process at 750° C. in the oxygen atmosphere.

Figure 9E:
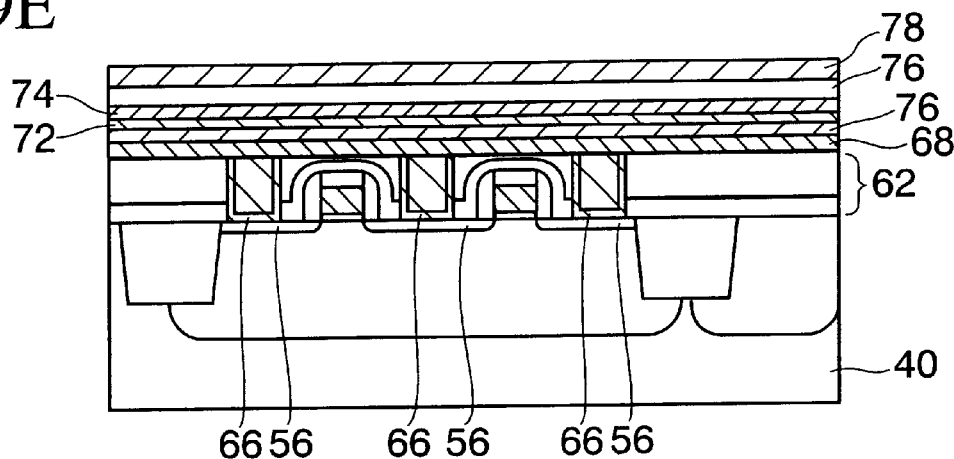

Then, an iridium oxide layer 78 of 200 nm thickness, for example, is formed on the PZT layer 76 by the sputter method, for example (FIG. 9E). The iridium oxide layer 78 of 200 nm thickness is formed by growing the layer for 81 seconds at the substrate temperature of 13° C., the power of 1 kW, the argon gas flow rate of 100 sccm, and the oxygen gas flow rate of 100 sccm, for example.

Figure 9F:
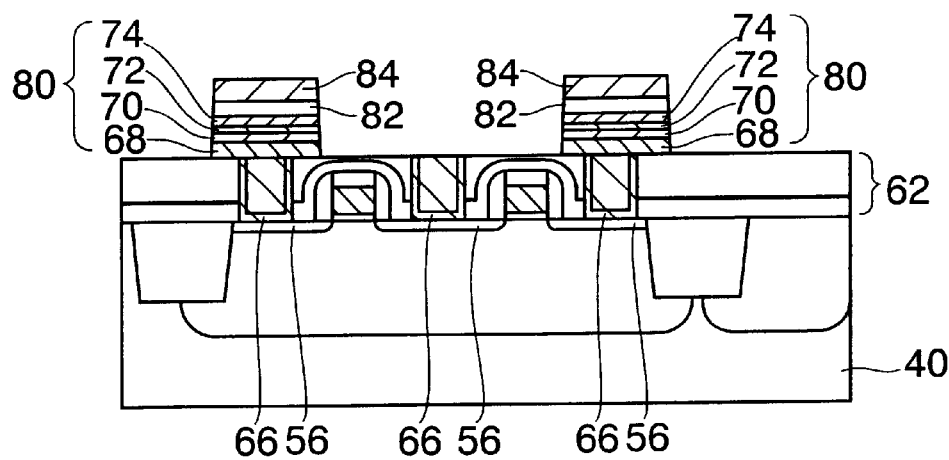

Then, the lower electrodes 80 consisting of the platinum layer 74/the platinum oxide layer 72/the iridium oxide layer 70/the iridium layer 68, the capacitor dielectric layers 82 formed on the lower electrodes 80 and consisting of the PZT layer, and the upper electrodes 84 formed on the capacitor dielectric layers 82 and consisting of the iridium oxide layer are formed by patterning the iridium oxide layer 78, the PZT layer 76, the platinum layer 74, the platinum oxide layer 72, the iridium oxide layer 70, and the iridium layer 68 into the same shape by virtue of the lithography and the dry etching (FIG. 9F).

In this fashion, the ferroelectric capacitors, which consist of the lower electrodes 80, the capacitor dielectric layers 82, and the upper electrodes 84 and in which the lower electrodes 80 are electrically connected to the source/drain diffusion layers 56 via the plugs 66, are formed.

Figure 9G:
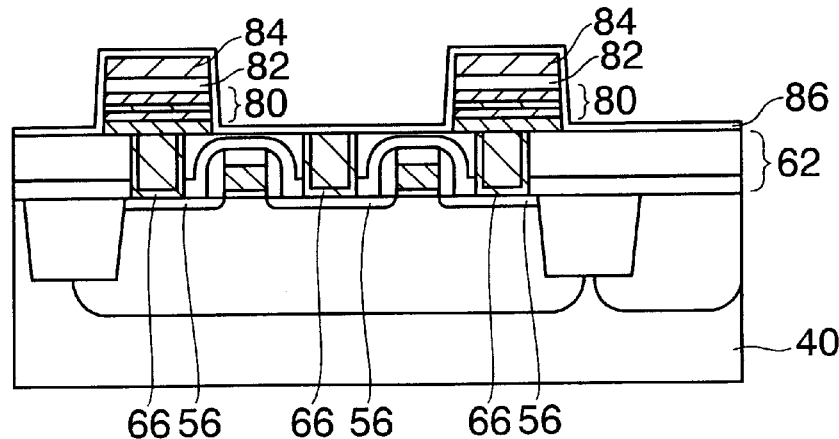

Then, the PZT layer of 40 nm thickness is formed on the entire surface by the sputter method, for example. In this case, this PZT layer functions as the ferroelectric capacitor protection layer 86 (FIG. 9G).

Then, the silicon oxide layer of 1100 nm thickness is formed on the ferroelectric capacitor protection layer 86 by the CVD method, for example.

Figure 9H:
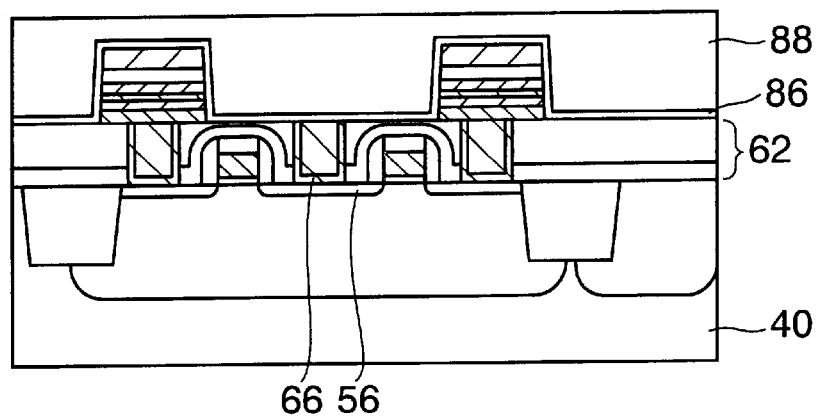
Figure 9I:
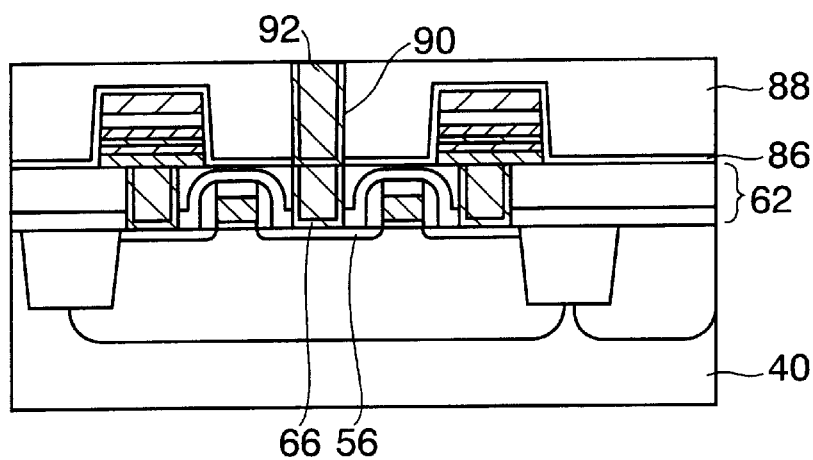

Then, an interlayer insulating layer 88 which is made of the silicon oxide layer and whose surface is planarized is formed by polishing a surface of the silicon oxide layer by means of the CMP method, for example (FIG. 9H). Then, contact holes 90 reaching the plugs 66 are formed in the interlayer insulating layer 88 by the lithography and the dry etching.

Then, the titanium layer of 20 nm thickness, the titanium nitride layer of 10 nm thickness, and the tungsten layer of 300 nm thickness, for example, are deposited on the overall surface by the CVD method, for example.

Then, the plug 92 that consists of the stacked structure of the W/TiN/Ti structure and is buried in the contact hole 90 is formed by polishing flat the tungsten layer, the titanium nitride layer, and the titanium layer by virtue of the CMP method, for example, until a surface of the interlayer insulating layer 88 is exposed (FIG. 11B).

Then, contact holes 94 reaching the upper electrodes 84 are formed in the interlayer insulating layer 88 by the lithography and the dry etching.

Then, the titanium layer of 60 nm thickness, the titanium oxide layer of 30 nm thickness, the Au—Cu layer of 400 nm thickness, the titanium layer of 5 nm thickness, and the titanium oxide layer of 70 nm thickness, for example, are deposited sequentially on the overall surface by the sputter method, for example.

Figure 9J:
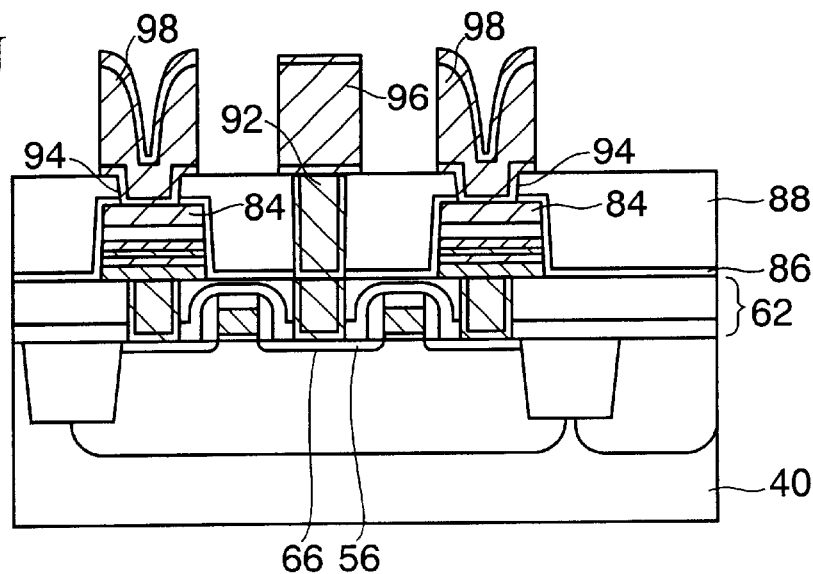

Then, a wiring layer 96 that is electrically connected to the source/drain diffusion layer 56 via the plugs 66, 92 and wiring layers 98 that are electrically connected to the upper electrodes 84 are formed by patterning the conductor having the TiN/Ti/Au—Cu/TiN/Ti structure, as shown FIG. 9J.

Like this, the ferroelectric memory having two transistors and two capacitors can be manufactured.

In this manner, according to the second embodiment, the capacitor lower electrode of the ferroelectric memory is constructed by the Pt/PtO$_x$/IrO$_x$/Ir structure. Thus, the diffusion of the oxygen in the course of the layer formation of the capacitor dielectric layer can be prevented by the iridium oxide layer and the iridium layer, and also the diffusion of the iridium from the oxygen diffusion barrier layer to the capacitor dielectric layer can be prevented by the platinum oxide layer. Therefore, even if the capacitor dielectric layer is formed by the sputtering, the sufficient crystallization of the capacitor dielectric layer can be attained while preventing the diffusion of the iridium. As a result, the high performance ferroelectric memory having the desired electric characteristics can be fabricated.

In this case, in the above second embodiment, the capacitor shown in FIG. 1 according to the first embodiment is applied as the capacitor of the ferroelectric memory. But the ferroelectric memory may be constructed by using the capacitor shown in FIG. 7 according to the variation of the first embodiment.

Third Embodiment

The present invention is not limited to the above embodiments and various variations may be applied.

For example, in the above embodiments, the $IrO_x/Ir$ structure and the Ir single-layer structure are shown as the oxygen diffusion barrier layer. In order to prevent the diffusion of the oxygen, at least the $IrO_x$ layer or the Ir layer may be formed between the plug and the capacitor dielectric layer. Therefore, other conductive layer in addition to the $Ir/IrO_x$ structure, the $IrO_x$ layer, the Ir layer, or the like may be formed. In this case, if the orientation control of the capacitor dielectric layer is taken into consideration, it is desired that, as described above, the uppermost layer should be formed of $IrO_x$.

Also, in the above embodiments, the platinum oxide layer is employed as the iridium diffusion barrier layer, but such platinum oxide layer may be employed by other conductive layer. There are the platinum group elements as the element having the property that is analogous to the platinum. Ruthenium (Ru), rhodium (Rh), palladium (Pd), osmium (Os), iridium (Ir) belong to this group. It may be considered that these elements other than the iridium can be applied as the iridium diffusion barrier layer. Accordingly, it may be concluded that any one of conductive oxides of these metal elements, i.e., $RuO_x$, $RhO_x$, $PdO_x$, and $OsO_x$ may be employed in place of the platinum oxide layer.

Similarly, the ruthenium layer, the rhodium layer, the palladium layer, or the osmium layer may be employed in place of the platinum layer that is formed on the iridium diffusion barrier layer.

Also, in the above embodiments, the case where the PZT layer is applied as the capacitor dielectric layer is shown. The present invention can be similarly applied to the case where other capacitor dielectric layer is employed. For example, the high-dielectric constant layer such as the BST ((Ba, Sr)TiO$_3$) layer, the ST (SrTiO$_x$) layer, the Ta$_2$O$_5$ layer, etc. or the ferroelectric layer such as Y1, etc. can be applied as the capacitor dielectric layer.

Also, in the above second embodiment, the case where the capacitor according to the present invention is applied to the ferroelectric memory is shown. But the capacitor according to the present invention can be applied to other semiconductor device. For example, DRAM may be constructed by using the capacitor according to the present invention, otherwise the capacitor according to the present invention may be employed as a single device.

Also, in the above embodiments, the platinum oxide layer is represented by $PtO_x$ and also the iridium oxide layer is represented by $IrO_x$. The composition ratio x of the oxygen in these metal oxides can be appropriately selected. In the typical layer, the composition ratio x can be set in the range of $0 < x \leq 2$.

In this case, the iridium oxide may be formed instead of the platinum as the upper electrode of the capacitor.

Fourth Embodiment

The lower electrodes of the capacitors shown in the first to third embodiments have the structure in which the oxygen barrier layer such as the Ir layer or the $IrO_x$ layer, the iridium diffusion preventing layer such as the $PtO_x$ layer, and the underlying dielectric layer such as the Pt layer are formed sequentially.

That is, the oxygen barrier layer has either the single layer structure of the Ir layer or the double-layered structure consisting of the Ir layer and the $IrO_x$ layer. Also, the iridium diffusion preventing layer prevents the diffusion of Ir in the oxygen barrier layer into the overlying PZT ferroelectric layer and is formed of the metal oxide that consists of the platinum group except Ir.

However, there is such a tendency that the (111) orientation of the uppermost Pt layer becomes weak in the lower electrode having such layer structure.

For example, like the first embodiment, the ferroelectric characteristic obtained when the PZT layer formed on the lower electrode having the structure, in which the Ir layer, the $IrO_x$ layer, the $PtO_x$ layer, and the Pt layer are formed sequentially, is annealed to crystallize is not good rather than the ferroelectric characteristic obtained when the PZT layer formed on the lower electrode having the structure, in which the Ti layer and the Pt layer are formed sequentially, is annealed to crystallize.

Therefore, in the fourth embodiment and embodiments described later, the capacitor that has the oxygen barrier layer and the iridium diffusion preventing layer and also the orientation improving interface layer for enhancing the (111) plane orientation of the Pt layer serving as the underlying layer of the ferroelectric layer as the structure of the lower electrode will be explained hereunder.

FIGS. 10A to 10E are sectional views showing steps of forming a capacitor according to a fourth embodiment of the present invention. The same references as those in FIG. 1 denote the same elements.

Figure 10A:
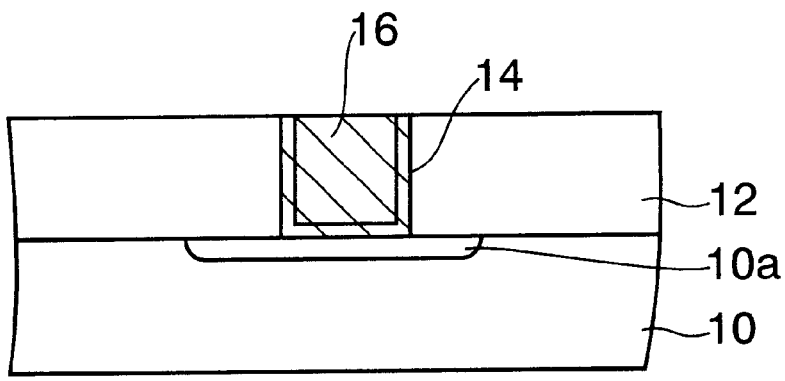
FIGS. 10A to 10E are sectional views showing steps in a method of manufacturing a capacitor according to a fourth embodiment of the present invention.

First, steps required until the structure shown in FIG. 10A is formed will be explained hereunder.

The interlayer insulating layer 12 made of SiO$_2$ is formed on the silicon substrate 10 on which the impurity diffusion region 10a is formed. Then, the contact hole 14 is formed o the impurity diffusion region 10a by etching the interlayer insulating layer 12 while using the resist pattern (not shown). Then, the titanium nitride (TiN) layer and the tungsten (W) layer are formed sequentially in the contact hole 14, and then the TiN layer and the W layer formed on the upper surface of the interlayer insulating layer 12 are removed by the CMP method. Accordingly, the W layer and the TiN layer left in the contact hole 14 are employed as the conductive plug 16.

Figure 10B:
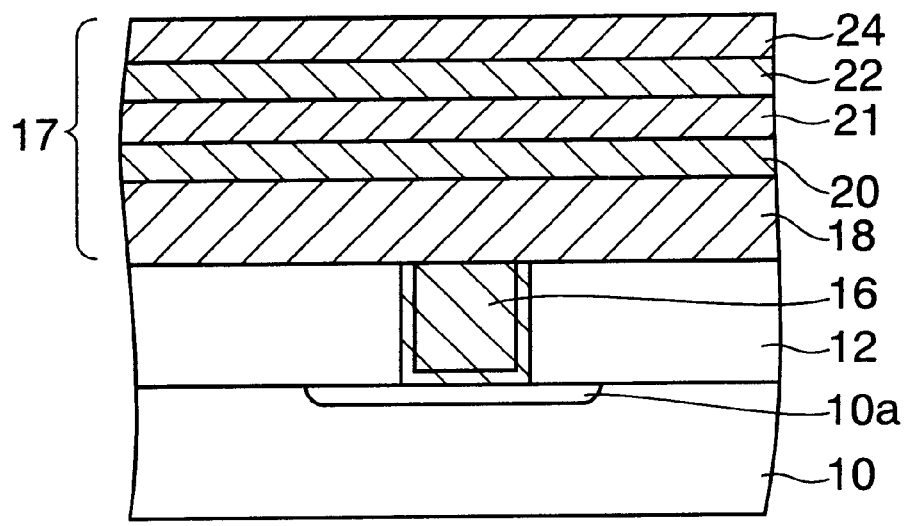

Then, as shown in FIG. 10B, the iridium (Ir) layer 18, the iridium oxide (IrO$_x$) layer 20, the first platinum (Pt) layer 21, the platinum oxide (PtO$_x$) layer 22, and the second platinum (Pt) layer 24 are formed sequentially on the plug 16 and the interlayer insulating layer 12 as the lower electrode conductive layer 17.

The Ir layer 18 of 200 nm thickness is formed by virtue of the sputter method by growing the layer for the growing time of 144 seconds at the substrate temperature of 400° C. and the power of 1 kW while introducing the argon (Ar) gas into the growth atmosphere at the flow rate of 100 sccm, for example.

The IrO$_x$ layer 20 of 28 nm thickness is formed by virtue of the sputter method by growing the layer for the growing time of 10 seconds at the substrate temperature of 400° C. and the power of 1 kW while introducing the argon (Ar) gas and the oxygen (O$_2$) gas into the growth atmosphere at the flow rates of 60 sccm and 20 sccm respectively, for example. According to such conditions, the composition ratio x of the oxygen (O) in the IrO$_x$ layer is x=1 to 1.2 to give the metallic structure. In this case, if the flow rates of both the Ar gas and the oxygen gas are set to 40 sccm in the forming conditions of the $IrO_x$ layer 20, the composition ratio x becomes larger than 1.2. In this case, the composition ratio x of the $IrO_x$ layer 20 is 0<x<2, for example.

The first Pt layer 21 is the Pt-interface layer to control the crystal orientation of the platinum oxide ($PtO_x$) layer 22 and the second platinum (Pt) layer 24. For example, the first Pt layer 21 of 5 nm thickness is formed by virtue of the sputter method by growing the layer for the growing time of 4 seconds at the substrate temperature of 350° C. and the power of 1 kW while introducing the Ar gas into the growth atmosphere at the flow rate of 100 sccm.

The $PtO_x$ layer 22 of 30 nm thickness is formed by virtue of the sputter method by growing the layer for the growing time of 27 seconds at the substrate temperature of 350° C. and the power of 1 kW while introducing the Ar gas and the oxygen ($O_2$) gas into the growth atmosphere at the flow rates of 36 sccm and 144 sccm respectively. The composition ratio x of the $PtO_x$ layer 22 is 0<x<2, for example.

The second Pt layer 24 of 50 nm thickness is formed by virtue of the sputter method by growing the layer for the growing time of 34 seconds at the substrate temperature of 100° C. and the power of 1 kW while introducing the Ar gas into the growth atmosphere at the flow rate of 100 sccm.

After this, the second Pt layer 24 is crystallized by executing the rapid thermal annealing process for 60 seconds at 750° C. in the argon introduced atmosphere.

Figure 10C:
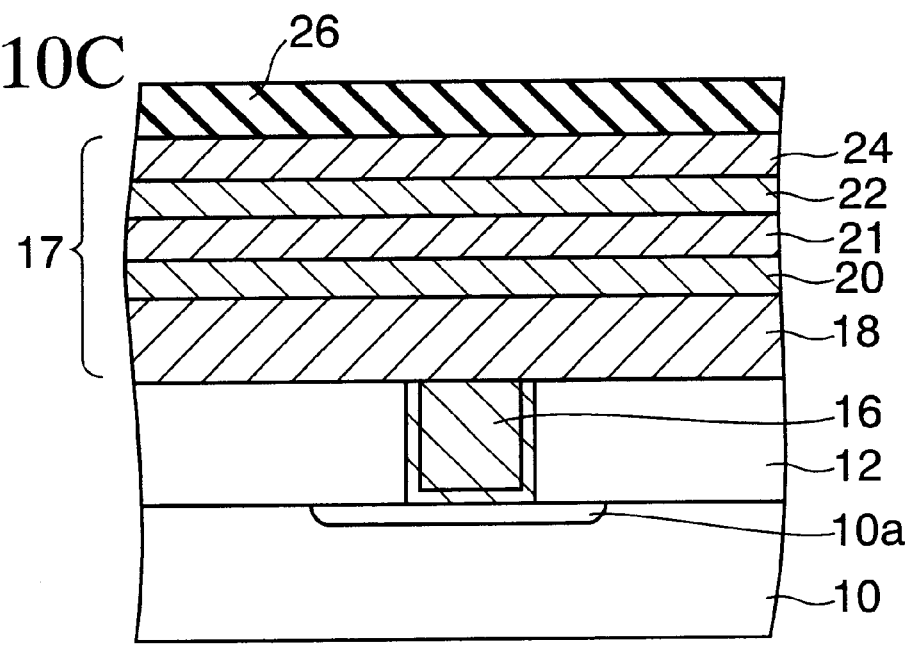

Next, as shown in FIG. 10C, the PZT ($Pb(Zr_x, Ti_{1-x})O_3$) layer 26 is formed on the second Pt layer 24 as the ferroelectric layer by the sputter method to have a thickness of 100 nm. In addition, the method of forming the ferroelectric layer 26 are the MOD (Metal Organic Deposition) method, the MOCVD (Metal Organic CVD) method, the sol-gel method, and others. Also, as the material of the ferroelectric layer 26, in addition to PZT, other PZT-based material such as PLCSZT, PLZT, etc., the Bi layer structure compound material such as SBT ($SrBi_2Ta_2O_9$), $SrBi_2(Ta, Nb)_2O_9$, etc., and other metal oxide ferroelectric substance may be employed. Also, if the high-dielectric capacitor is to be formed, the high-dielectric layer such as $Ba_xSr_{1-x}TiO_3$, $SrTiO_3$, PLZT, etc. is formed in place of the ferroelectric layer.

Then, the PZT layer 26 is crystallized by executing the rapid thermal annealing process at 750° C.

Figure 10D:
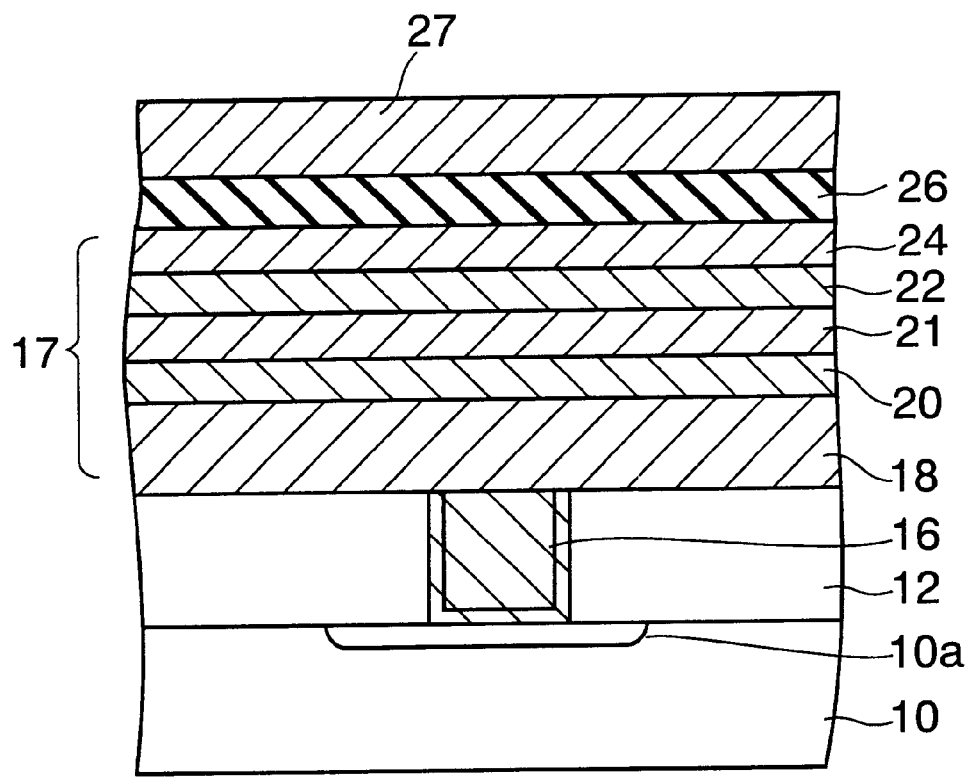

Then, as shown in FIG. 10D, the $IrO_x$ layer is formed on the PZT layer 26 as an upper electrode conductive layer 27. In this case, the Pt layer may be formed instead of the $IrO_x$ layer as the upper electrode conductive layer 27.

Figure 10E:
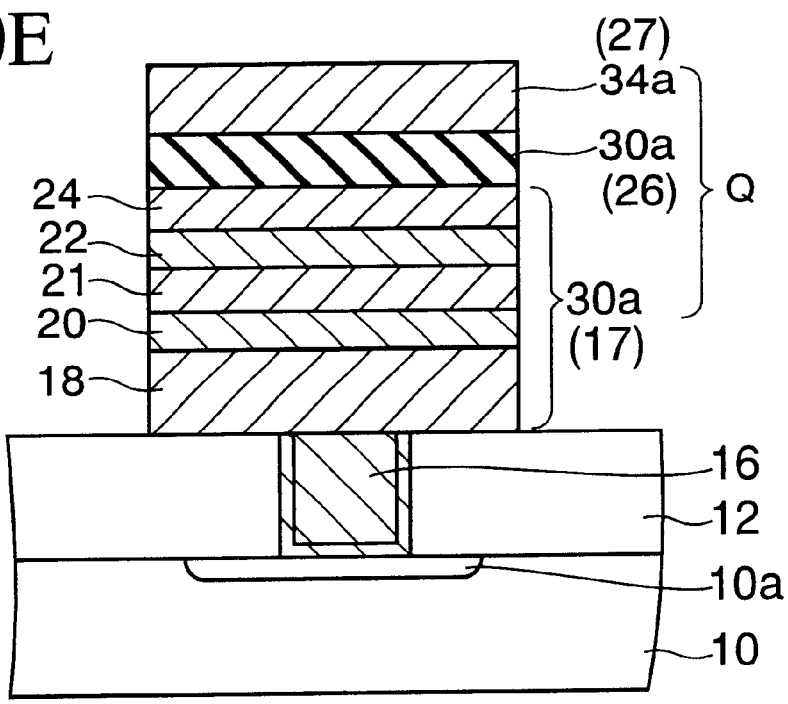

After this, as shown in FIG. 10E, the capacitor Q is formed by patterning the upper electrode conductive layer 27, the PZT layer 26, and the lower electrode conductive layer 17 by means of the photolithography method. According to this patterning, the upper electrode conductive layer 27 is formed into the upper electrode 34a of the capacitor Q, the PZT layer 26 is formed into the dielectric layer 32a of the capacitor Q, and the lower electrode conductive layer 17 is formed into the lower electrode 30a of the capacitor Q.

By the way, the polarization direction of the PZT layer 26 is (001), but it is very difficult to orient the polarization direction to (001). Therefore, it is normal that the crystal of the PZT layer 26 is oriented in the (111) direction to increase the residual polarization (switching) of the PZT layer 26.

For this reason, it is preferable that the PZT layer 26 that is formed on the lower electrode conductive layer 17 in the capacitor Q forming steps should be oriented in the (111) plane direction to reflect the orientation of the second Pt layer 24 as the underlying layer.

Thus, it is checked experimentally to what extent the difference in the (111) integrated intensity of the second Pt layer 24 and the (111) integrated intensity of the PZT layer is caused depending on whether or not the Pt-interface layer 21 out of plural layers constituting the above lower electrode 30a is provided.

As the reference, the capacitor having the lower electrode in which the Ir layer, the $IrO_x$ layer, the $PtO_x$ layer, and the Pt layer are formed sequentially, the PZT dielectric layer that is crystallized on the lower electrode, and the $IrO_x$ upper electrode is employed. In the reference capacitor, when the (111) integrated intensity of the Pt layer constituting the lower electrode is measured by the X-ray diffraction method and also the (111) integrated intensity of the PZT dielectric layer is measured by the X-ray diffraction method, the result shown by "REF" in FIG. 11 is derived.

Figure 11:
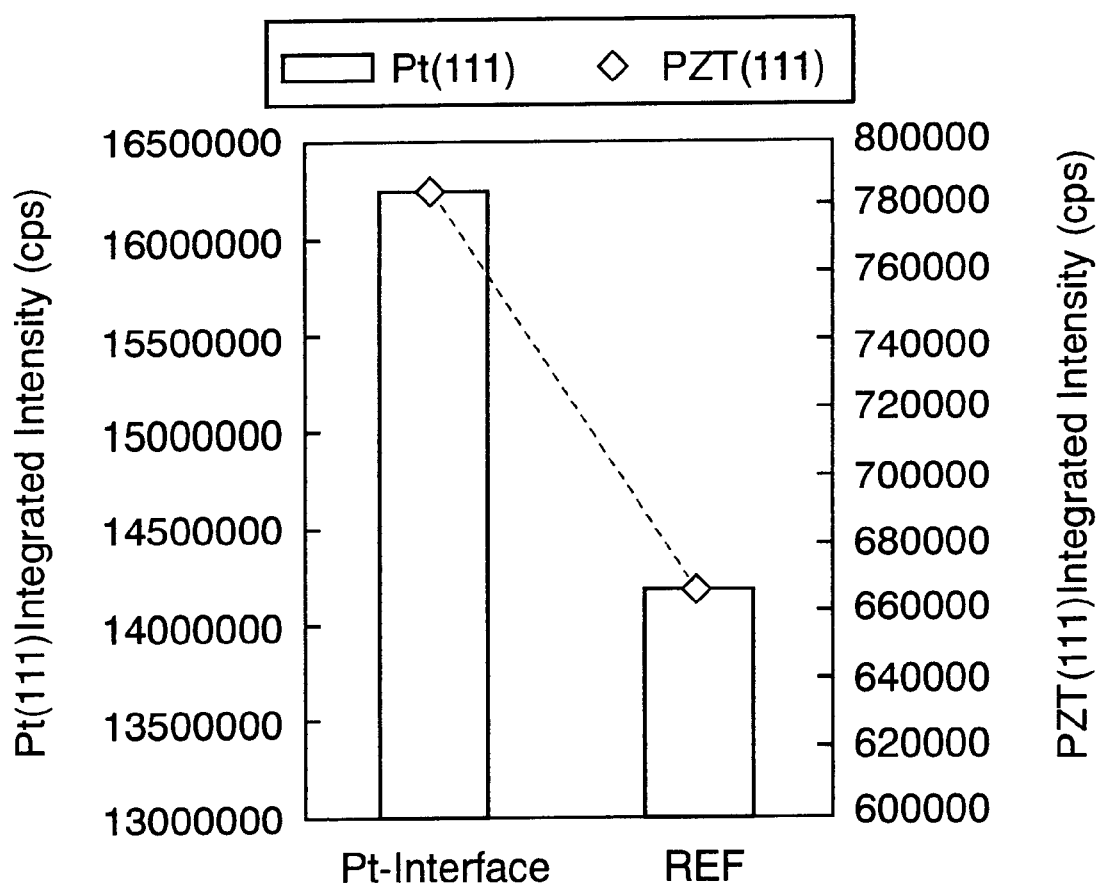
FIG. 11 is a view showing respective (111) integrated intensities of the lower electrode, that constitutes the capacitor according to the fourth embodiment of the present invention and the reference capacitor respectively, and the PZT layer that is crystallized on the lower electrode.

In addition, in the capacitor Q shown in FIG. 10E according to the fourth embodiment, when the (111) integrated intensity of the second Pt layer 24 constituting the lower electrode 30a having the Pt-interface layer 21 is measured by the X-ray diffraction method and also the (111) integrated intensity of the overlying PZT layer 26 is measured by the X-ray diffraction method, the result shown by "Pt-Interface" in FIG. 11 is derived.

According to FIG. 11, the (111) integrated intensity of the Pt layer 24 in the lower electrode 30a having the $Pt/PtO_x/Pt/IrO_x/Ir$ structure in the capacitor Q of the fourth embodiment becomes higher than the (111) integrated intensity of the Pt layer as the uppermost layer in the lower electrode having the $Pt/PtO_x/IrO_x/Ir$ structure in the reference capacitor by 15%. Also, the (111) integrated intensity of the PZT layer 26 in the capacitor Q of the fourth embodiment becomes higher than the (111) integrated intensity of the PZT layer in the reference capacitor by 18%.

Next, the difference in the polarization saturation voltage of the ferroelectric capacitor due to whether or not the Pt-interface layer is provided in the lower electrode structure will be explained hereunder.

As the reference, the capacitor $Q_0$ having the lower electrode in which the Ir layer, the $IrO_x$ layer, the $PtO_x$ layer, and the Pt layer are formed sequentially, the PZT dielectric layer that is crystallized on the lower electrode, and the $IrO_x$ upper electrode is prepared.

Also, as the capacitor according to the fourth embodiment, the capacitor having the structure shown in FIG. 10E is employed. The difference in the polarization saturation voltage of the capacitor according to the fourth embodiment caused when the forming conditions of the $IrO_x$ layer 20 in the $Pt/PtO_x/Pt/IrO_x/Ir$ structure constituting the lower electrode 30a of the capacitor according to the fourth embodiment are changed is also examined. In the forming conditions of the $IrO_x$ layer 20, only flow rates of the argon and the oxygen supplied to the sputter atmosphere are changed but other conditions are not changed. In order to form the $IrO_x$ layer 20, the flow rate of argon is set to 40 sccm and the flow rate of oxygen is set to 40 sccm in the first condition, while the flow rate of argon is set to 60 sccm and the flow rate of oxygen is set to 20 sccm in the second condition. The $IrO_x$ layer formed in the second condition is more metallic than the $IrO_x$ layer formed in the first condition.

Figure 12:
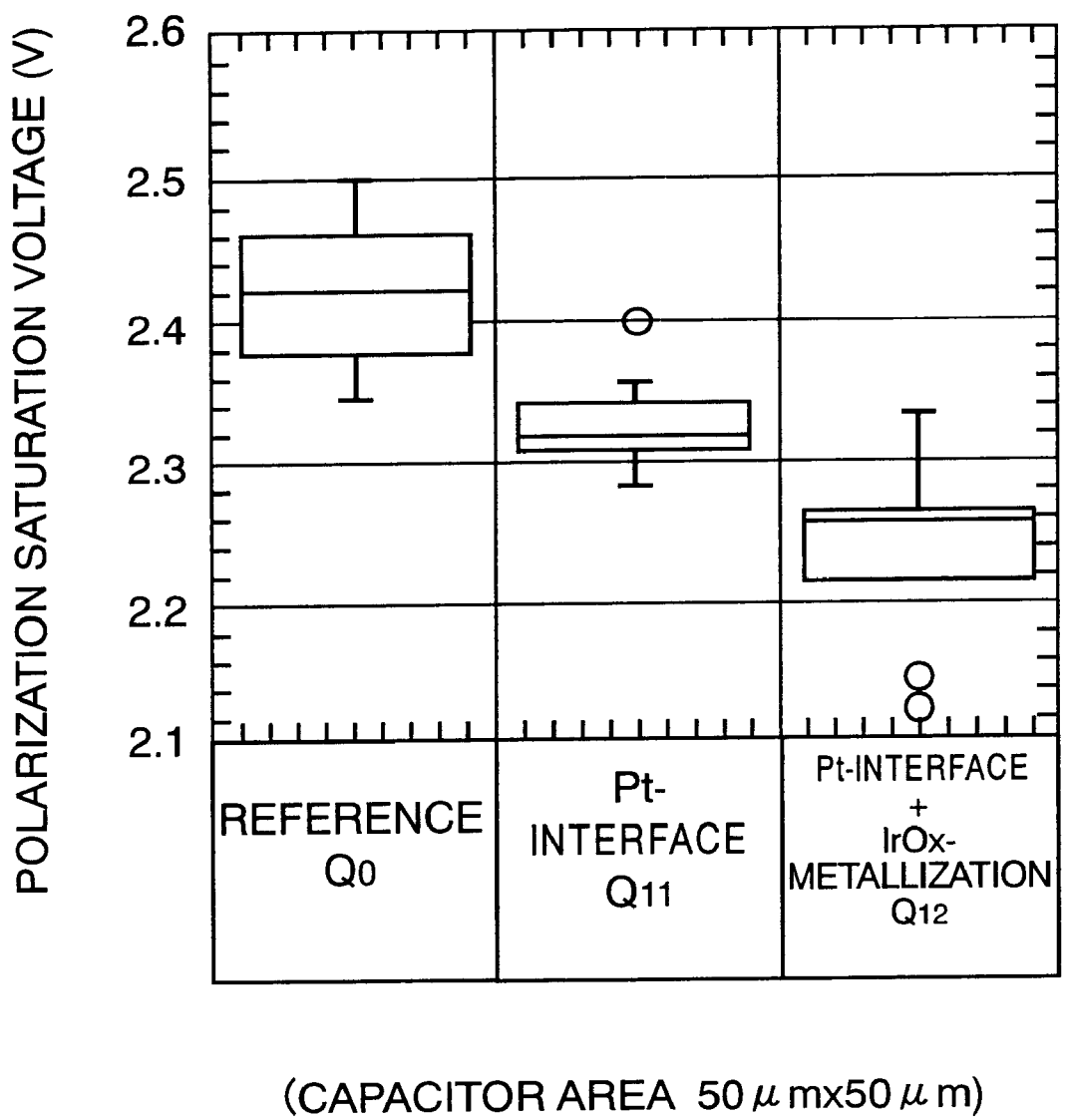
FIG. 12 is a view showing the polarization saturation voltage of the ferroelectric capacitor due to the difference in respective lower electrode structures of the capacitor according to the fourth embodiment of the present invention and the reference capacitor.

When the polarization saturation voltages of the capacitor $Q_{11}$ according to the fourth embodiment that has the $IrO_x$ layer 20 formed in the first condition in the lower electrode 30a, the capacitor $Q_{12}$ according to the fourth embodiment that has the $IrO_x$ layer 20 formed in the second condition in the lower electrode 30a, and the reference capacitor $Q_0$ are measured respectively, results shown in FIG. 12 are derived. In this case, the planar shape of respective capacitors $Q_0$, $Q_{11}$, $Q_{12}$ used in measurement has a size of 50 $\mu$m×50 $\mu$m.

In order to examine the polarization saturation voltage, the hysteresis characteristics of the capacitors $Q_0$, $Q_{11}$, $Q_{12}$ are measured by using the Sawyer-Tower Circuit. Then, the voltage change in the load capacitor is measured as the polarization change of the capacitor in response to the change in the applied voltage. In this case, the polarization inversion charge amount (switching charge amount) is examined by using the triangular wave of 1.2 V to 3.0 V as the applied voltage. The polarization saturation voltage is defined as the voltage that causes the switching charge amount to reach 90% of the saturation value.

According to FIG. 12, the polarization saturation voltage of the capacitor $Q_{11}$ according to the fourth embodiment that has the $IrO_x$ layer 20 formed in the first condition in the lower electrode 30a becomes lower than the polarization saturation voltage of the reference capacitor $Q_0$ by 0.1 V. Also, the polarization saturation voltage of the capacitor $Q_{12}$ according to the fourth embodiment that has the $IrO_x$ layer 20 metallized by the second condition in the lower electrode 30a becomes lower than the polarization saturation voltage of the reference capacitor $Q_0$ by 0.2 V.

As a result, it is found that, if the Pt-interface layer 21 is formed between the $PtO_x$ layer 22 and the $IrO_x$ layer 20 like the capacitors $Q_{11}$, $Q_{12}$ according to the fourth embodiment, the (111) orientation of the second Pt layer 24 and the PZT layer 26 is enhanced and also the polarization saturation voltage of them is lowered than the reference capacitor $Q_0$.

Also, it is found that, even in the capacitor according to the fourth embodiment, the smaller oxygen amount contained in the $IrO_x$ layer 20 constituting the lower electrode 30a contributes the reduction in the polarization saturation voltage of the capacitor.

In FIG. 12, the measurement of the polarization saturation voltage of respective capacitors $Q_0$, $Q_{11}$, $Q_{12}$ is carried out plural times respectively. The vertical line indicates the range in which a measured value appears in the measurement, and the portion shown by a tetragon indicates the range in which the measured values are converged in the vertical line.

Next, the difference in the switching charge amount of the ferroelectric capacitor due to whether or not the Pt-interface layer is provided in the lower electrode structure will be explained hereunder.

As the reference, the reference capacitor $Q_0$ having the same structure as that used in the test in FIG. 12 is employed. Also, as the capacitor according to the fourth embodiment, like the capacitor used in the test in FIG. 12, the capacitor $Q_{11}$ that has the $IrO_x$ layer 20 formed in the first condition in the lower electrode 30a and the capacitor $Q_{12}$ that has the metallic $IrO_x$ layer 20 formed in the second condition in the lower electrode 30a are employed. The capacitors $Q_{11}$, $Q_{12}$ according to the fourth embodiment have the Pt-interface layer 21, unlike the reference capacitor $Q_0$. In this case, the planar shape of respective capacitors $Q_0$, $Q_{11}$, $Q_{12}$ used in measurement has a size of 50 $\mu$m×50 $\mu$m.

Figure 13:
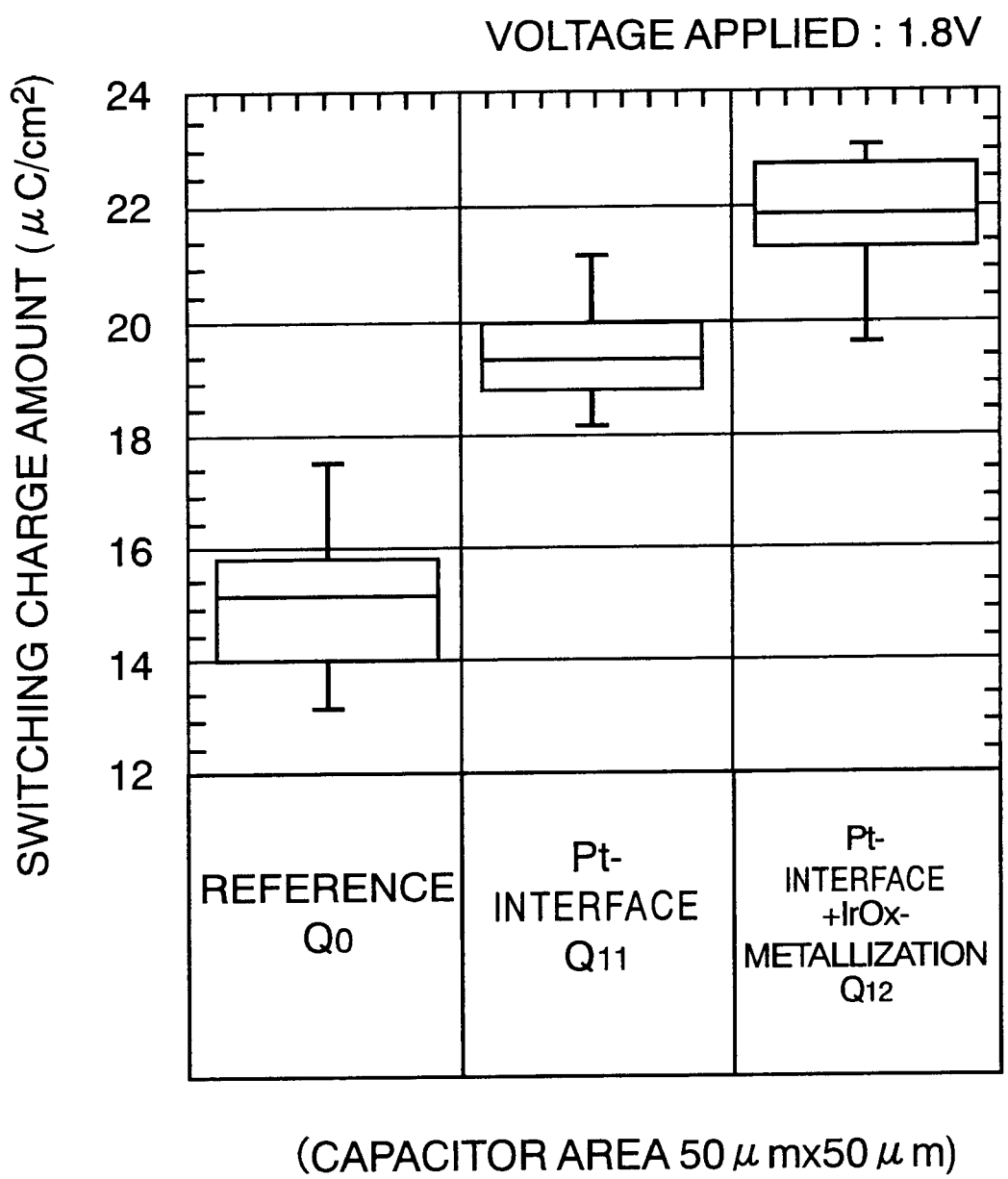
FIG. 13 is a view showing the switching charge amount of the ferroelectric capacitor at the applied voltage of 1.8 V due to the difference in respective lower electrode structures of the capacitor according to the fourth embodiment of the present invention and the reference capacitor.

When the switching charge amount is examined if the applied voltage to the capacitors $Q_0$, $Q_{11}$, $Q_{12}$ is set to 1.8 V, results shown in FIG. 13 are derived. Also, when the switching charge amount is examined if the applied voltage is set to 3.0 V, results shown in FIG. 14 are derived.

In FIG. 13, the switching charge amount of the capacitor $Q_{11}$ according to the fourth embodiment that has the $IrO_x$ layer 20 formed in the first condition in the lower electrode 30a becomes higher than the switching charge amount of the reference capacitor $Q_0$ by about 4 $\mu$C/cm². Also, the switching charge amount of the capacitor $Q_{12}$ according to the fourth embodiment that has the $IrO_x$ layer 20 metallized by the second condition in the lower electrode 30a becomes higher than the switching charge amount of the reference capacitor $Q_0$ by about 2 $\mu$C/cm².

Figure 14:
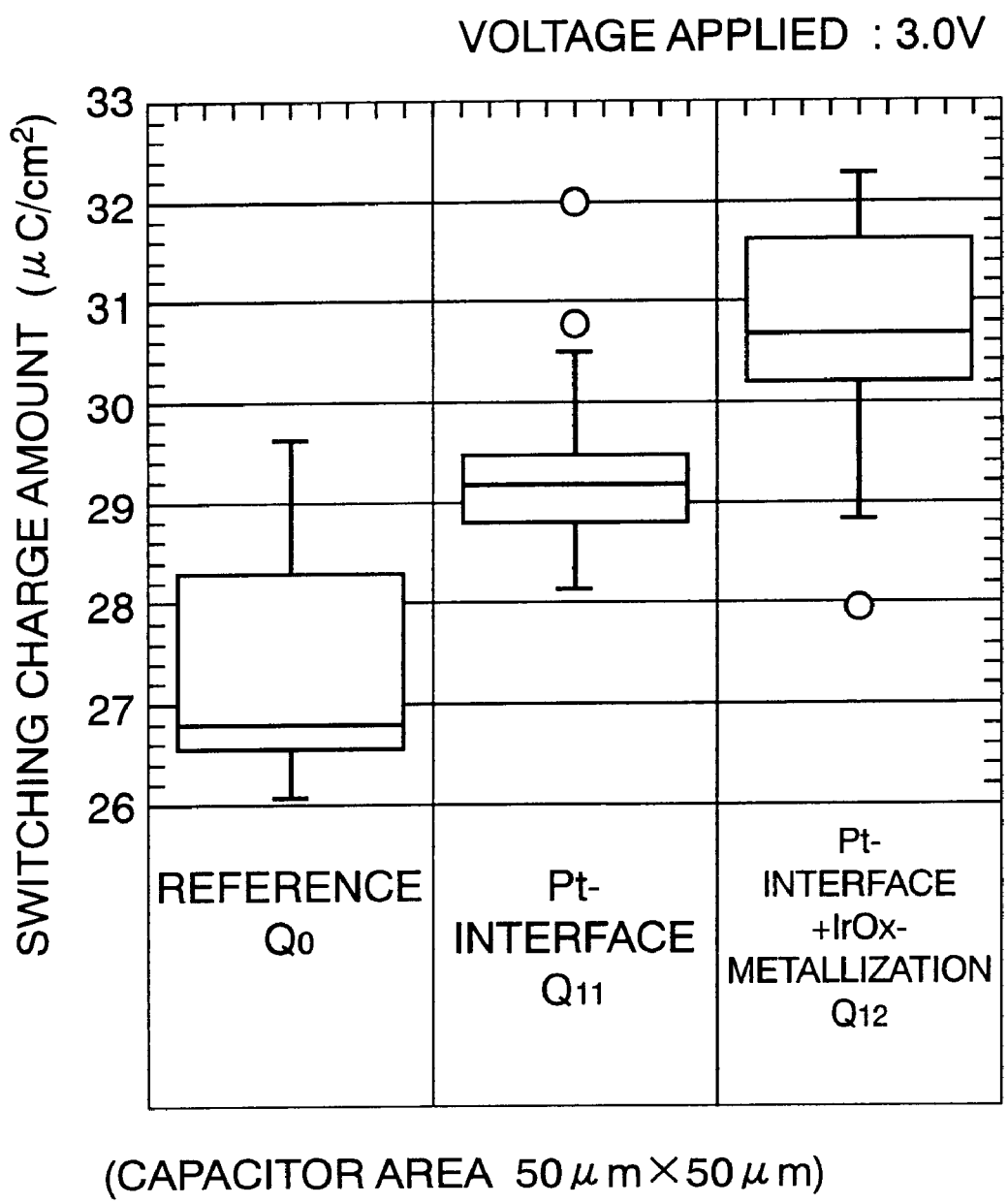
FIG. 14 is a view showing the switching charge amount of the ferroelectric capacitor at the applied voltage of 3.0 V due to the difference in respective lower electrode structures of the capacitor according to the fourth embodiment of the present invention and the reference capacitor.

Also, according to FIG. 14, the switching charge amount of the capacitor $Q_{11}$ according to the fourth embodiment that has the $IrO_x$ layer 20 formed in the first condition in the lower electrode 30a becomes higher than the switching charge amount of the reference capacitor $Q_0$ by about 2 $\mu$C/cm². Also, the switching charge amount of the capacitor $Q_{12}$ according to the fourth embodiment that has the $IrO_x$ layer 20 metallized by the second condition in the lower electrode 30a becomes higher than the switching charge amount of the reference capacitor $Q_0$ by about 2 $\mu$C/cm².

As a result, it is found that, if the Pt-interface layer 21 is formed between the $PtO_x$ layer 22 and the $IrO_x$ layer 20 in the lower electrode 30a like the capacitors $Q_{11}$, $Q_{12}$ according to the fourth embodiment, the (111) orientation of the second Pt layer 24 and the PZT layer 26 is enhanced rather than the reference capacitor $Q_0$ and also the switching charge amount of them is increased rather than the reference capacitor $Q_0$.

In FIG. 12 and FIG. 14, the measurement of the polarization saturation voltage of respective capacitors $Q_0$, $Q_{11}$, $Q_{12}$ is carried out plural times respectively. The vertical line indicates the range in which a measured value appears in the measurement, and the portion shown by a tetragon indicates the range in which the measured values are converged in the vertical line.

Next, respective examined results of the leakage current density, the fatigue loss, and the retention characteristic of the ferroelectric capacitor due to the difference in respective lower electrode structures will be explained hereunder.

As the reference used in these examinations, the capacitor $Q_0$ having the same structure as that employed in the test in FIG. 11 is employed. Also, as the capacitor used in these examinations according to the fourth embodiment, like the capacitor used in FIG. 11, the capacitor $Q_{11}$ that has the $IrO_x$ layer 20 formed in the first condition in the lower electrode 30a and the capacitor $Q_{12}$ that has the metallic $IrO_x$ layer 20 formed in the second condition in the lower electrode 30a are employed. Both the capacitors $Q_{11}$, $Q_{12}$ according to the fourth embodiment have the Pt-interface layer 21. In this case, the planar shape of respective capacitors $Q_0$, $Q_{11}$, $Q_{12}$ used in measurement is set to the size of 50 $\mu$m×50 $\mu$m.

Figure 15:
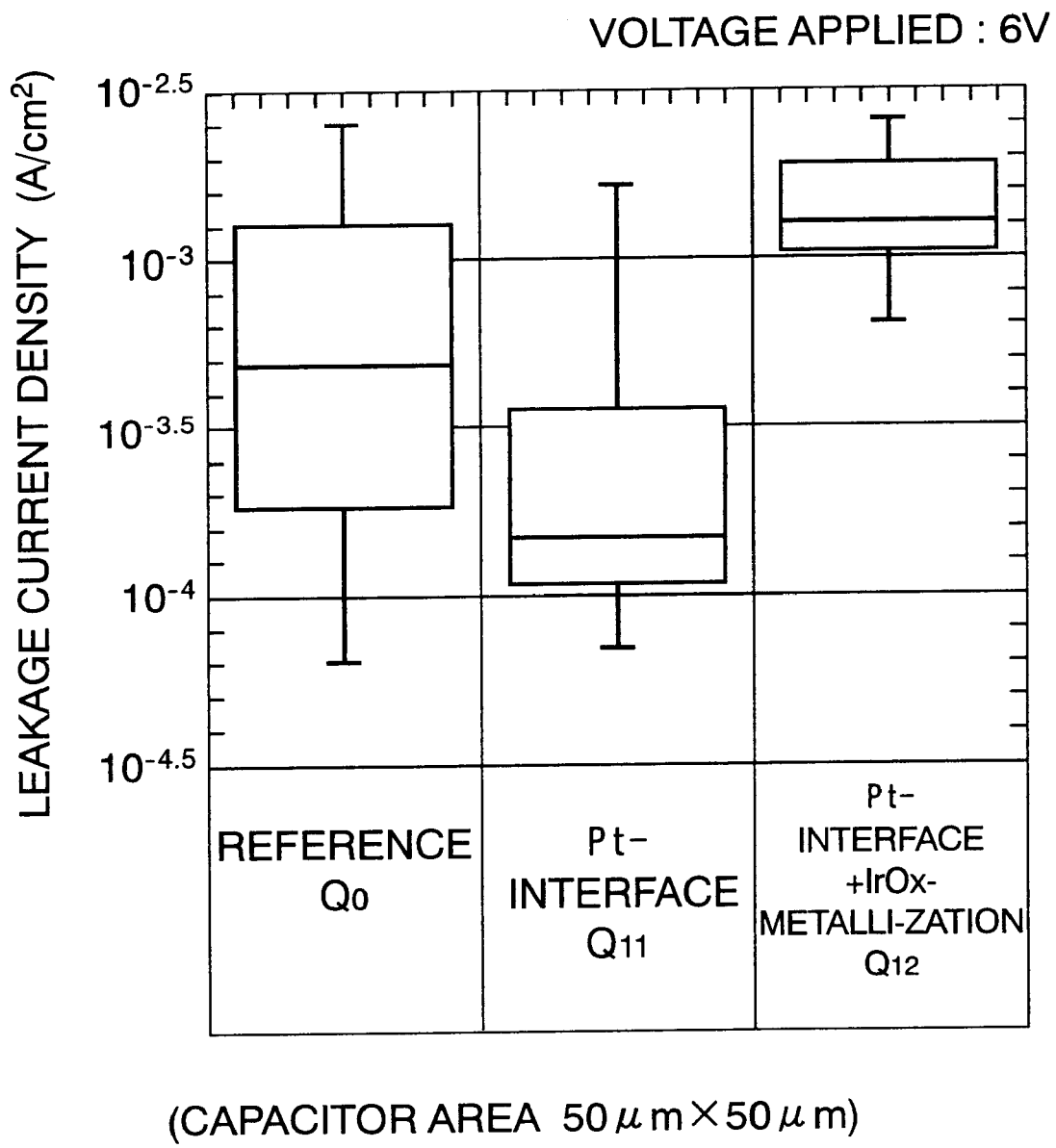
FIG. 15 is a view showing the leakage current density of the ferroelectric capacitor due to the difference in respective lower electrode structures of the capacitor according to the fourth embodiment of the present invention and the reference capacitor.

First, examined results of the leakage current density of three types of the capacitors $Q_0$, $Q_{11}$, $Q_{12}$ that have the lower electrodes having different structures are shown in FIG. 15. The measurement of the leakage current density of respective capacitors $Q_0$, $Q_{11}$, $Q_{12}$ is carried out plural times respectively. The vertical line indicates the range in which a measured value appears in the measurement, and the portion shown by the tetragon indicates the range in which the measured values are converged in the vertical line.

In FIG. 15, the leakage current of the reference capacitor $Q_0$ that does not have the Pt-interface layer in the lower electrode is about $1\times10^{-3.75}$ A/cm² to $1\times10^{-2.90}$ A/cm². Also, the leakage current of the capacitor $Q_{11}$ according to the fourth embodiment that has the $IrO_x$ layer 20 formed in the first condition in the lower electrode 30a is about $1\times10^{-3.45}$ A/cm² to $1\times10^{-3.98}$ A/cm². Also, the leakage current of the capacitor $Q_{12}$ according to the fourth embodiment that has the metallic $IrO_x$ layer 20 formed in the second condition in the lower electrode 30a is about $1\times10^{-3.0}$ A/cm² to $1\times10^{-2.90}$ A/cm². In this case, the measurement of the leakage current is carried out by applying the voltage of 6V between the upper electrode and the lower electrode of respective capacitors $Q_0$, $Q_{11}$, $Q_{12}$.

According to FIG. 15, it is found that the leakage current is not so different between the reference capacitor $Q_0$ and the capacitors $Q_{11}$, $Q_{12}$ according to the fourth embodiment. This is because the diffusion of Ir into the PZT layer 26 can be prevented by the PtO$_x$ layer 22. As a result, it is found that the lower electrode 30a of the capacitors $Q_{11}$, $Q_{12}$ according to the fourth embodiment has the leakage current preventing effect.

Figure 16:
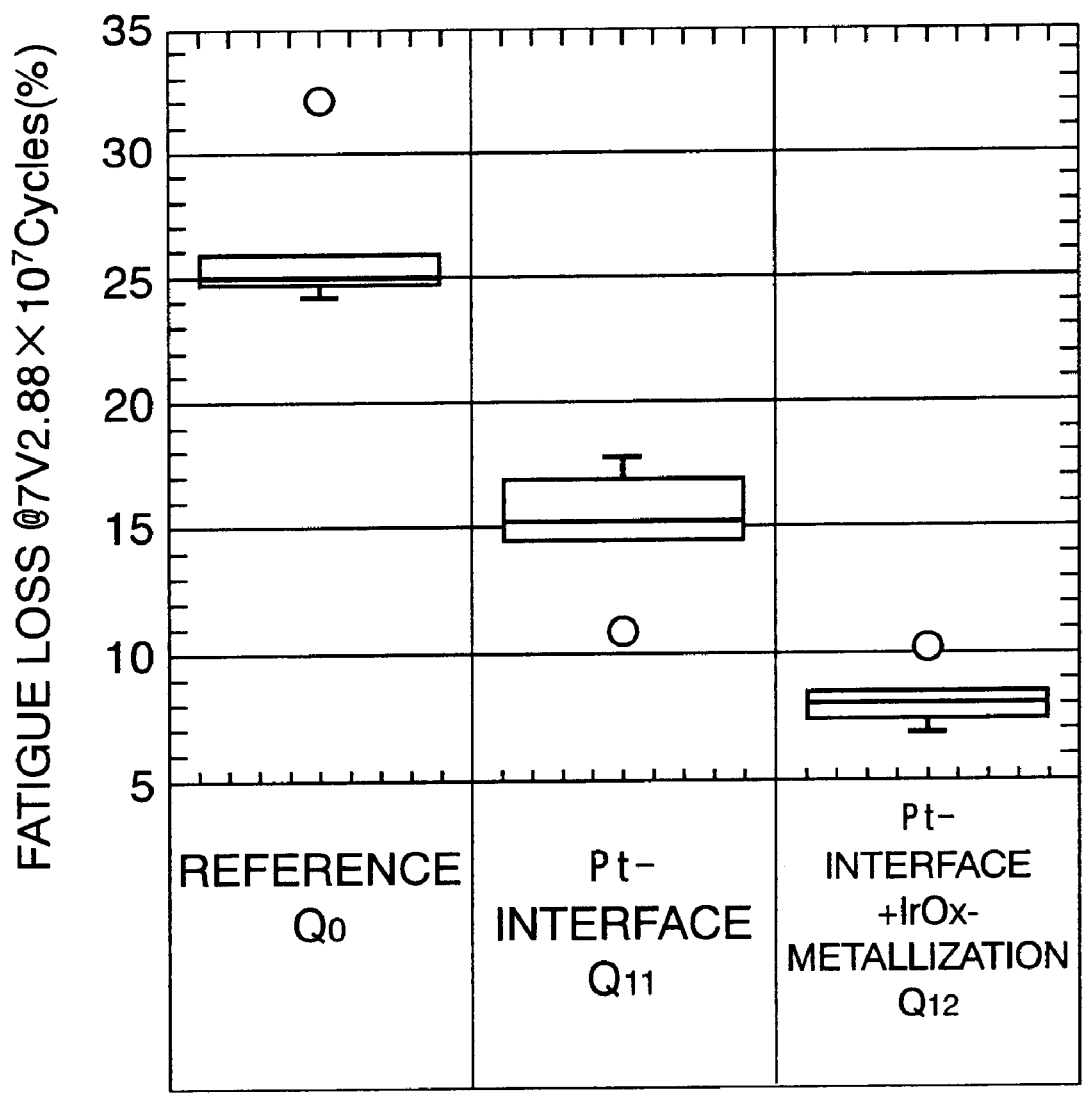
FIG. 16 is a view showing the fatigue loss characteristic of the ferroelectric capacitor due to the difference in respective lower electrode structures of the capacitor according to the fourth embodiment of the present invention and the reference capacitor.

Next, examined results of the fatigue loss of the PZT layer of three types of the capacitors $Q_0$, $Q_{11}$, $Q_{12}$ that have the lower electrodes having different structures are shown in FIG. 16. The measurement of the fatigue loss of respective capacitors $Q_0$, $Q_{11}$, $Q_{12}$ is carried out plural times respectively. The vertical line indicates the range in which a measured value appears in the measurement, and the portion shown by a tetragon indicates the range in which the measured values are converged in the vertical line.

The fatigue loss is measured by applying the voltage of ±7.0 V to respective capacitors $Q_0$, $Q_{11}$, $Q_{12}$ as the examined object to cause the polarization, setting the operation cycle of the polarization inversion to 250 ns, and comparing the polarization charge amount obtained after 2.880×10$^7$ cycles with the initial polarization charge amount.

In FIG. 16, the fatigue loss of the capacitor $Q_{11}$ according to the fourth embodiment that has the IrO$_x$ layer 20 formed in the first condition in the lower electrode 30a becomes lower than the fatigue loss of the reference capacitor $Q_0$ by about 10%. Also, the fatigue loss of the capacitor $Q_{12}$ according to the fourth embodiment that has the metallic IrO$_x$ layer 20 formed in the second condition in the lower electrode 30a becomes lower than the fatigue loss of the reference capacitor $Q_0$ by about 15%.

In other words, according to the capacitors $Q_{11}$, $Q_{12}$ of the fourth embodiment, it is found that, because the Pt-interface layer is inserted between the PtO$_x$ layer 22 and the IrO$_x$ layer 20 in the lower electrode 30a, the (111) orientation of the second Pt layer 24 and the PZT layer 26 can be enhanced to improve the layer quality and thus the fatigue loss can be reduced. In addition, it is found that, if the IrO$_x$ layer 20 constituting the lower electrode 30a is metallized by reducing the oxygen concentration, the layer quality of the PZT layer can be further improved and the fatigue loss can be reduced much more.

Figure 17:
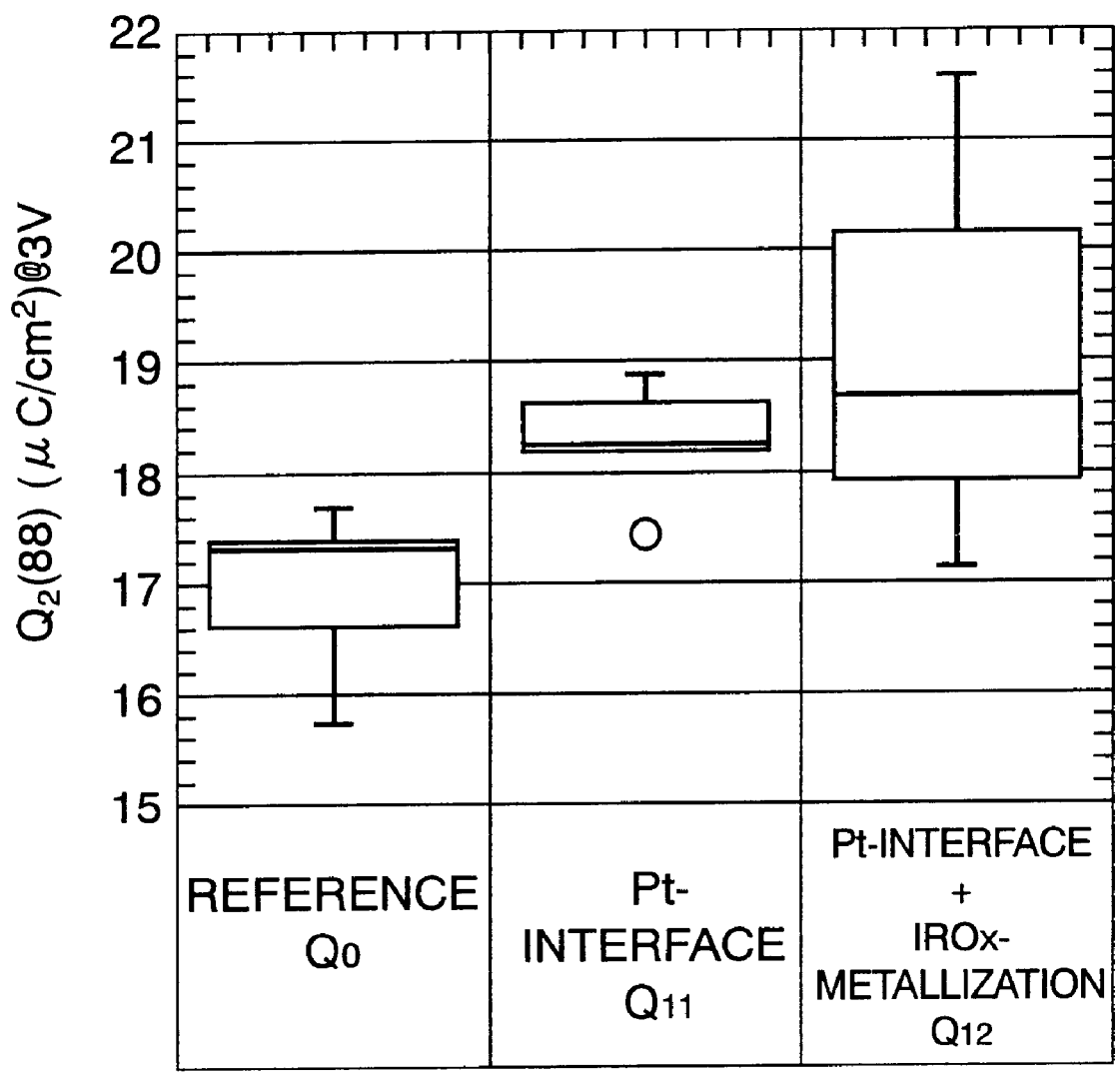
FIG. 17 is a view showing the retention characteristic of the ferroelectric capacitor due to the difference in respective lower electrode structures of the capacitor according to the fourth embodiment of the present invention and the reference capacitor.

Next, respective examined results of the retention characteristic of the PZT layer of three types of the capacitors $Q_0$, $Q_{11}$, $Q_{12}$ that have the lower electrodes having different structures are shown in FIG. 17. The measurement of the retention characteristic of respective capacitors $Q_0$, $Q_{11}$, $Q_{12}$ is carried out plural times respectively. The vertical line indicates the range in which a measured value appears in the measurement, and the portion shown by the tetragon indicates the range in which the measured values are converged in the vertical line.

The retention characteristic is the polarization holding characteristic such that the polarization electric charge value is reduced with the lapse of time after the capacitor is polarized in one direction by the applied voltage.

In the measurement of the retention characteristic, in case the capacitor is polarized into the (+) direction by applying 3 V, for example, to the upper electrode and then such capacitor is left as it is for a predetermined time at the temperature of 150° C. , and in case the capacitor is polarized into the (−) direction by applying −3 V, for example, to the upper electrode and then such capacitor is left as it is for a predetermined time at the temperature of 150° C., the held amounts (reduced amount) of the polarization value are measured respectively.

FIG. 17 shows the polarization holding amount $Q_2$ (88) of respective capacitors after such polarized capacitors $Q_0$, $Q_{11}$, $Q_{12}$ are left as they are for 88 hours at the temperature of 150° C. According to FIG. 17, if the capacitors $Q_{11}$, $Q_{12}$ according to the fourth embodiment in which the Pt-interface layer 21 is inserted between the PtO$_x$ layer 22 and the IrO$_x$ layer 20 in the lower electrode 30a are compared with the reference capacitor $Q_0$ that does not have the Pt-interface layer in the lower electrode, the layer quality of the PZT layer 26 can be improved and thus the retention characteristic can be increased by about 2 $\mu$C/cm$^2$.

As described above, numerical values of the electric characteristics of the capacitors $Q_{11}$, $Q_{12}$ according to the fourth embodiment are equal satisfactorily to the planar-type capacitor that employs the lower titanium layer/upper platinum (Pt/Ti) structure as the lower electrode. In particular, the capacitors $Q_{11}$, $Q_{12}$ according to the fourth embodiment can overcome the important subjects that are indispensable to the development of the next-generation FeRAM, e.g., the switching electric charge amount at the low voltage is enhanced, etc.

When the adhesiveness test of the lower electrode 30a of the capacitors $Q_{11}$, $Q_{12}$ according to the fourth embodiment is executed, the peeling is difficult to occur at the interface between the PtO$_x$ layer 22 and the IrO$_x$ layer 20 rather than the lower electrode in which the Pt-interface layer 21 is not provided between the PtO$_x$ layer 22 and the IrO$_x$ layer 20. Also, it is found that, if the oxygen composition ratio x in the IrO$_x$ layer 20 as the underlying layer of the Pt-interface layer 21 is reduced into 1 to 1.2, for example, even in the lower electrode 30a that has the Pt-interface layer 21, the defect occurring ratio in the adhesiveness between the PtO$_x$ layer 22 and the IrO$_x$ layer 20 can be reduced into about ⅟7 and thus the effect of improving the adhesiveness of the multi-layered layer constituting the lower electrode 30a becomes remarkable.

In this case, the adhesiveness test is executed by the tension test by which the epoxy resin is pulled after such epoxy resin is pasted on the upper electrode of the capacitor and then dried for one hour at 150° C.

Figure 18:
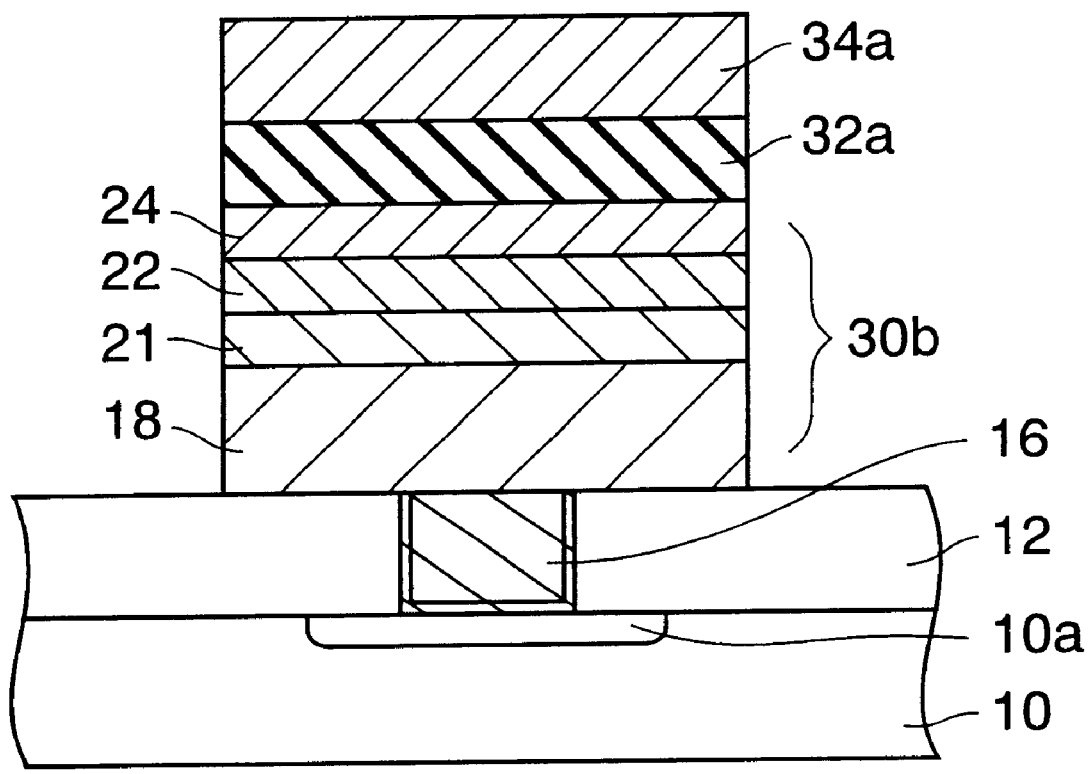
FIG. 18 is a sectional view showing another example of the capacitor according to the fourth embodiment of the present invention.

Meanwhile, as described above, the IrO$_x$ layer may be removed from the lower electrode 30a having the Pt/PtO$_x$/IrO$_x$/Ir structure, or the lower electrode 30b having the Pt/PtO$_x$/Pt/Ir structure (30b) shown in FIG. 18 may be employed. In this case, the layer quality of the PZT layer 26 formed on the lower electrode 30b can be improved by the presence of the Pt-interface layer 21. Also, in the lower electrode 30b having the Pt/PtO$_x$/Pt/Ir structure, the lower-most Ir layer 18 is the oxygen barrier layer, the first Pt layer (Pt-interface layer) 21 is the orientation enhancing and density improving layer, the PtO$_x$ layer 22 is the iridium diffusion preventing layer, and the uppermost second Pt layer 23 is the orientation control layer of the PZT layer 26.

In the lower electrode 30a, the rhodium layer or the palladium layer may be formed in place of the second Pt layer 24, the ruthenium layer may be formed in place of the Ir layer 18, and the ruthenium oxide layer may be formed in place of the IrO$_x$ layer 20. Also, respective metal layers or metal oxide layers constituting the lower electrode 30a are not limited to above layer thicknesses. It is preferable that the layer thickness of the Pt-interface layer 21 should be within the range of 3 to 50 nm.

Fifth Embodiment

FIGS. 19A to 19K are sectional views showing steps of manufacturing an FeRAM memory cell according to a fifth embodiment of the present invention.

Figure 19A:
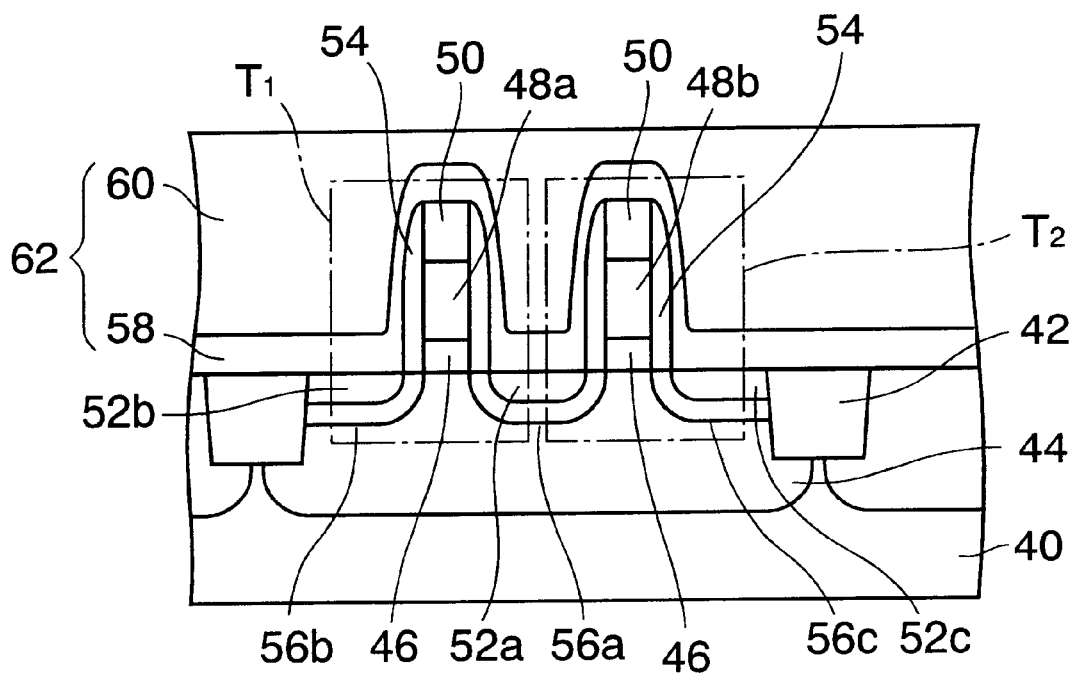

First, steps required until the sectional structure shown in FIG. 19A is obtained will be explained hereunder.

As shown in FIG. 19A, an element isolation trench is formed around a transistor forming region of an n-type or p-type silicon (semiconductor) substrate 40 by the photolithography method. Then, an element isolation layer 42 is formed by filling silicon oxide ($SiO_2$) in the element isolation trench. The element isolation layer 42 having such structure is called STI (Shallow Trench Isolation). In this case, an insulating layer formed by the LOCOS (Local Oxidation of Silicon) method may be employed as the element isolation layer.

Then, a P-well 44 is formed by introducing a p-type impurity into the transistor forming region of the silicon substrate 40. Then, a silicon oxide layer serving as the gate insulating layer 46 is formed by thermally oxidizing a surface of the transistor forming region of the silicon substrate 40.

Then, an amorphous silicon layer or polysilicon layer and a silicon nitride layer are formed sequentially on the overall upper surface of the silicon substrate 40. Then, the gate electrodes 48a, 48b on which the silicon nitride layer 50 is stacked are formed by patterning the silicon layer and the silicon nitride layer by virtue of the photolithography method.

In this case, two gate electrodes 48a, 48b are formed in parallel on one p-well 44. These gate electrodes 48a, 48b constitute a part of the word line.

Then, first to third n-type impurity diffusion regions 56a to 56c serving as the source/drain are formed by ion-implanting the n-type impurity into the p-well 44 both sides of the gate electrodes 48a, 48b.

Then, the insulating layer, e.g., the silicon oxide ($SiO_2$) layer, is formed on the overall surface of the silicon substrate 40 by the CVD method. Then, the insulating layer is etched back and is left as insulating sidewall spacers 54 on both sides of the gate electrodes 48a, 48b.

Then, the high-concentration impurity regions 52a to 52c are formed by ion-implanting the n-type impurity into the first to third n-type impurity diffusion regions 56a to 56c while using the gate electrodes 48a, 48b and the sidewall spacers 54 as a mask. Thus, the first to third n-type impurity diffusion regions 56a to 56c are formed as the LDD structure.

The first n-type impurity diffusion region 56a formed between two gate electrodes 48a, 48b in one transistor forming region is connected electrically to the bit line, while the second and third n-type impurity diffusion regions 56b, 56c formed on both sides of the transistor forming region are connected electrically to the lower electrode of the capacitor described later.

According to the above steps, two MOS transistors $T_1$, $T_2$ having the gate electrodes 48a, 48b and the n-type impurity diffusion regions 56a to 56c are formed in the p-well 44.

Then, a silicon oxide nitride (SiON) layer of about 200 nm thickness, which serves as the cover insulating layer 58 for covering the MOS transistors $T_1$, $T_2$, is formed on the overall surface of the silicon substrate 40 by the plasma CVD method. Then, the silicon oxide layer 60 of about 1.0 $\mu$m thickness is formed on the cover insulating layer 58 by the plasma CVD method using the TEOS gas.

Then, the silicon oxide layer 60 is thermally treated for 30 minutes at the temperature of 700° C. in the nitrogen atmosphere at the normal pressure, for example, as the densifying process of the silicon oxide layer 60. After this, the upper surface of the silicon oxide layer 60 is planarized by the chemical mechanical polishing (CMP) method.

In this case, the silicon oxide layer 60 and the cover insulating layer 58 constitute the first interlayer insulating layer 62.

Figure 19B:
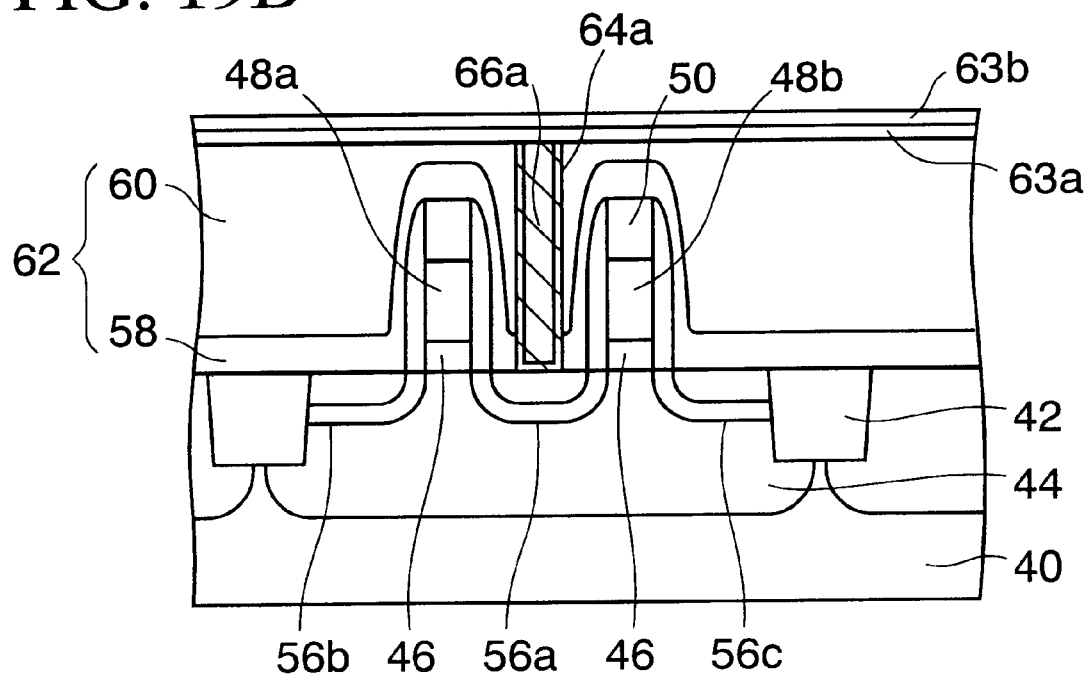

Next, steps required until the state shown in FIG. 19B is obtained will be explained hereunder.

First, a first contact hole 64a having a depth that reaches the first impurity diffusion region 56a is formed by patterning the first interlayer insulating layer 62 by means of the photolithography method. Then, the titanium nitride (TiN) layer of 50 nm thickness is formed as a glue layer on the first interlayer insulating layer 62 and in the first contact hole 64a by the sputter method. In addition, the first contact hole 64a is perfectly buried by growing the tungsten (W) layer on the TIN layer by virtue of the CVD method using $WF_6$.

Then, the W layer and the TiN layer are removed from the upper surface of the first interlayer insulating layer 62 by polishing them by means of the CMP method. The tungsten layer and the TIN layer left in the first contact hole 64a are used as a first conductive plug 66a.

Then, an oxidation preventing insulating layer 63a made of silicon nitride ($Si_3N_4$) having a 100 nm thickness and an underlying insulating layer 63b made of $SiO_2$ having a 100 nm thickness are formed sequentially on the first interlayer insulating layer 62 and the first conductive plug 66a by the plasma CVD method. The $SiO_2$ layer is grown by the plasma CVD method using TEOS. The oxidation preventing insulating layer 63a is formed to prevent the event that the first conductive plug 66a is excessively oxidized by the heating process such as the later annealing, etc. to occur the contact failure. It is desired that the thickness of the oxidation preventing insulating layer 63a should be set to 70 nm or more, for example.

Figure 19C:
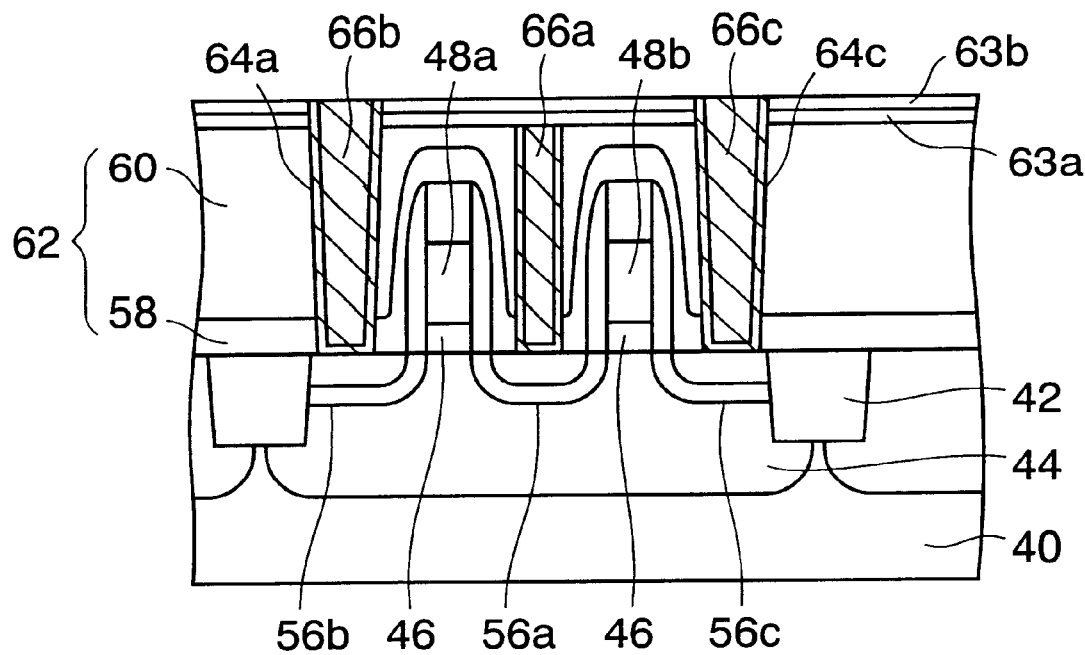

Next, steps required until the state shown in FIG. 19C is obtained will be explained hereunder.

First, second and third contact holes 64b, 64c are formed on the second and third impurity diffusion regions 56b, 56c by etching the oxidation preventing insulating layer 63a, the underlying insulating layer 63b, and the first interlayer insulating layer 62 while using the resist pattern (not shown).

Then, the Ti layer of 20 nm thickness and the TiN layer of 50 nm thickness are formed as the glue layer on the underlying insulating layer 63b and in the second and third contact holes 64b, 64c by the sputter method. Then, the second and third contact holes 64b, 64c are buried perfectly by growing the W layer on the TiN layer by means of the CVD method.

In turn, the W layer and the TiN layer and the Ti layer are removed from the upper surface of the underlying insulating layer 63b by polishing them by virtue of the CMP method. Accordingly, the W layer and the TiN layer and the Ti layer left in the second and third contact holes 64b, 64c are used as second and third conductive plugs 66b, 66c respectively.

Figure 19D:
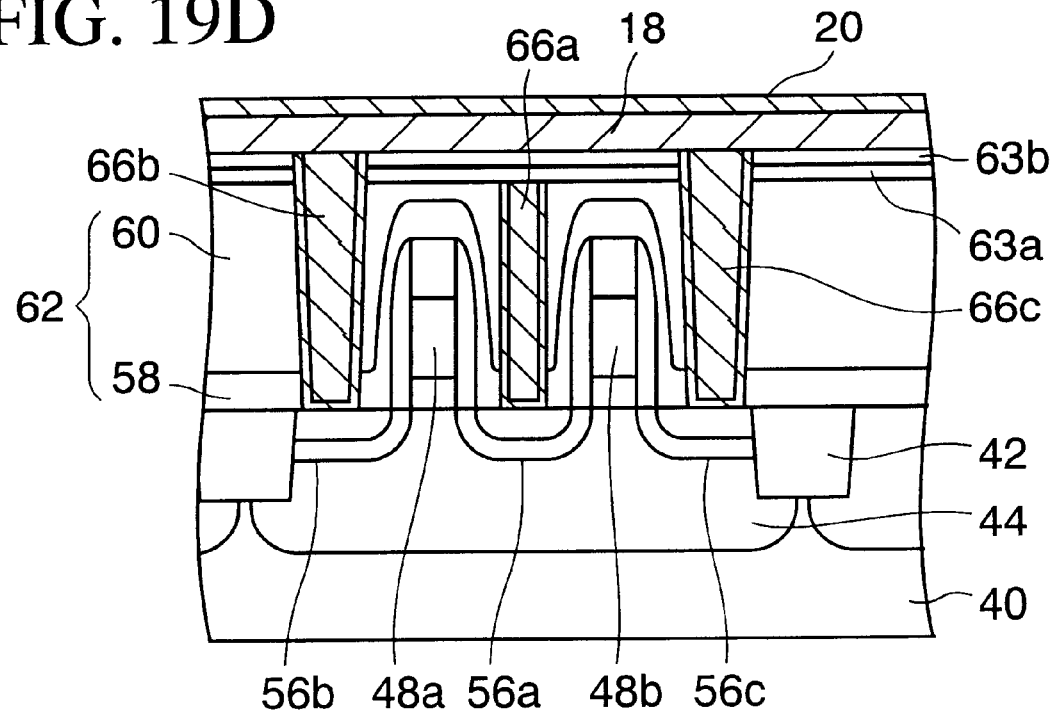

Next, steps required until the structure shown in FIG. 19D is formed will be explained hereunder.

First, as shown in FIG. 19D, the iridium (Ir) layer 18 and the iridium oxide ($IrO_x$) layer 20 are formed on the second and third conductive plugs 66b, 66c and the underlying insulating layer 63b.

The Ir layer 18 of 200 nm thickness is formed by the sputter method under the conditions that, for example, the substrate temperature is set to 400° C., the power is set to 1 kW, the argon (Ar) gas is introduced into the growth atmosphere at the flow rate of 100 sccm, and the growth time is set to 144 seconds.

The $IrO_x$ layer 20 of 28 nm thickness is formed by the sputter method under the conditions that, for example, the substrate temperature is set to 400° C., the power is set to 1 kW, the argon (Ar) gas is introduced into the growth atmosphere at the flow rate of 60 sccm, the oxygen ($O_2$) gas is introduced into the growth atmosphere at the flow rate of 20 sccm, and the growth time is set to 10 seconds. According to such conditions, the composition ratio x of the oxygen (O) in the $IrO_x$ layer 20 is x=1 to 1.2 to provide the metallic structure.

Then, as shown in FIG. 19E, the first platinum (Pt) layer 21, the platinum oxide ($PtO_x$) layer 22, and the second platinum (Pt) layer 24 are formed in sequence on the $IrO_x$ layer 20.

The first Pt layer 21 is the Pt-interface layer to control the crystal orientation of the platinum oxide ($PtO_x$) layer 22. For example, the first Pt layer 21 of 5 nm thickness is formed by the sputter method under the conditions that, for example, the substrate temperature is set to 350° C., the power is set to 1 kW, the Ar gas is introduced into the growth atmosphere at the flow rate of 100 sccm, and the growth time is set to 4 seconds.

The $PtO_x$ layer 22 of 30 nm thickness is formed by the sputter method under the conditions that, for example, the substrate temperature is set to 350° C., the power is set to 1 kW, the Ar gas is introduced into the growth atmosphere at the flow rate of 36 sccm, the oxygen ($O_2$) gas is introduced into the growth atmosphere at the flow rate of 144 sccm, and the growth time is set to 27 seconds.

The second Pt layer 24 of 50 nm thickness is formed by the sputter method under the conditions that, for example, the substrate temperature is set to 100° C., the power is set to 1 kW, the Ar gas is introduced into the growth atmosphere at the flow rate of 100 sccm, and the growth time is set to 34 seconds.

In this case, it is preferable that the first Pt layer 21, the $PtO_x$ layer 22, and the second Pt layer 24 should be formed successively by the same sputter equipment.

Then, the second Pt layer 24 is crystallized by executing the rapid thermal annealing process for 60 seconds at 750° C. in the argon-introduced atmosphere.

The $Pt/PtO_x/Pt/IrO_x/Ir$ structure consisting of the Ir layer 18, the $IrO_x$ layer 20, the first Pt layer 21, the $PtO_x$ layer 22, and the second Pt layer 24, as described above, is used as the lower electrode conductive layer 17.

Then, as shown in FIG. 19F, the PZT layer of 100 nm thickness, for example, is formed on the lower electrode conductive layer 17 as the ferroelectric layer 26 by the sputter method. As the material of the ferroelectric layer 26, in addition to PZT, other PZT-based material such as PLCSZT, PLZT, etc., the Bi layer structure compound material such as SBT ($SrBi_2Ta_2O_9$), $SrBi_2(Ta, Nb)_2O_9$, etc., and other metal oxide ferroelectric substance may be employed. Also, if the high-dielectric capacitor is to be formed, the high-dielectric layer such as $Ba_xSr_{1-x}TiO_3$, $SrTiO_3$, PLZT, etc. is formed in place of the ferroelectric layer.

Then, the ferroelectric layer 26 is crystallized by executing the annealing in the oxygen atmosphere. As the annealing, for example, two-step rapid thermal annealing (RTA) process that comprises the annealing executed for a time of 90 seconds at the substrate temperature of 600° C. in the mixed gas atmosphere of argon and oxygen as the first step, and the annealing executed for a time of 60 seconds at the substrate temperature of 750° C. in the oxygen atmosphere as the second step.

Also, the iridium oxide ($IrO_x$) of 200 nm thickness, for example, is formed as the upper electrode conductive layer 27 on the ferroelectric layer 26 by the sputter method. In this case, the Pt layer may be formed as the upper electrode conductive layer 27 in place of the $IrO_x$ layer.

After this, the TiN layer and the $SiO_2$ layer are formed sequentially on the upper electrode conductive layer 27 as a hard mask (not shown). This hard mask is patterned by the photolithography method to form the planar shape of the capacitor over the second and third conductive plugs 66b, 66c.

Then, as shown in FIG. 19G, the upper electrode conductive layer 27, the ferroelectric layer 26, and the lower electrode conductive layer 17 located in the region not covered with the hard mask (not shown) are etched sequentially.

As a result, the lower electrode 30a made of the lower electrode conductive layer 17, the dielectric layer 32a made of the ferroelectric layer 26, and the upper electrode 34a made of the upper electrode conductive layer 27 are formed on the underlying insulating layer 63b. Thus, the capacitor Q is formed by the upper electrode 34a, the ferroelectric layer 26, and the lower electrode 30a.

Then, in the transistor forming region, one lower electrode 30a is connected electrically to the second impurity diffusion region 56b via the second conductive plug 66b, and also the other lower electrode 30a is connected electrically to the third impurity diffusion region 56c via the third conductive plug 66c.

After this, the hard mask (not shown) is removed.

Then, in order to recover the damage of the ferroelectric layer 26 due to the etching, the recovery annealing is carried out. In this case, the recovery annealing is carried out at the substrate temperature of 650° C. for 60 minutes in the oxygen atmosphere, for example.

Figure 19H:
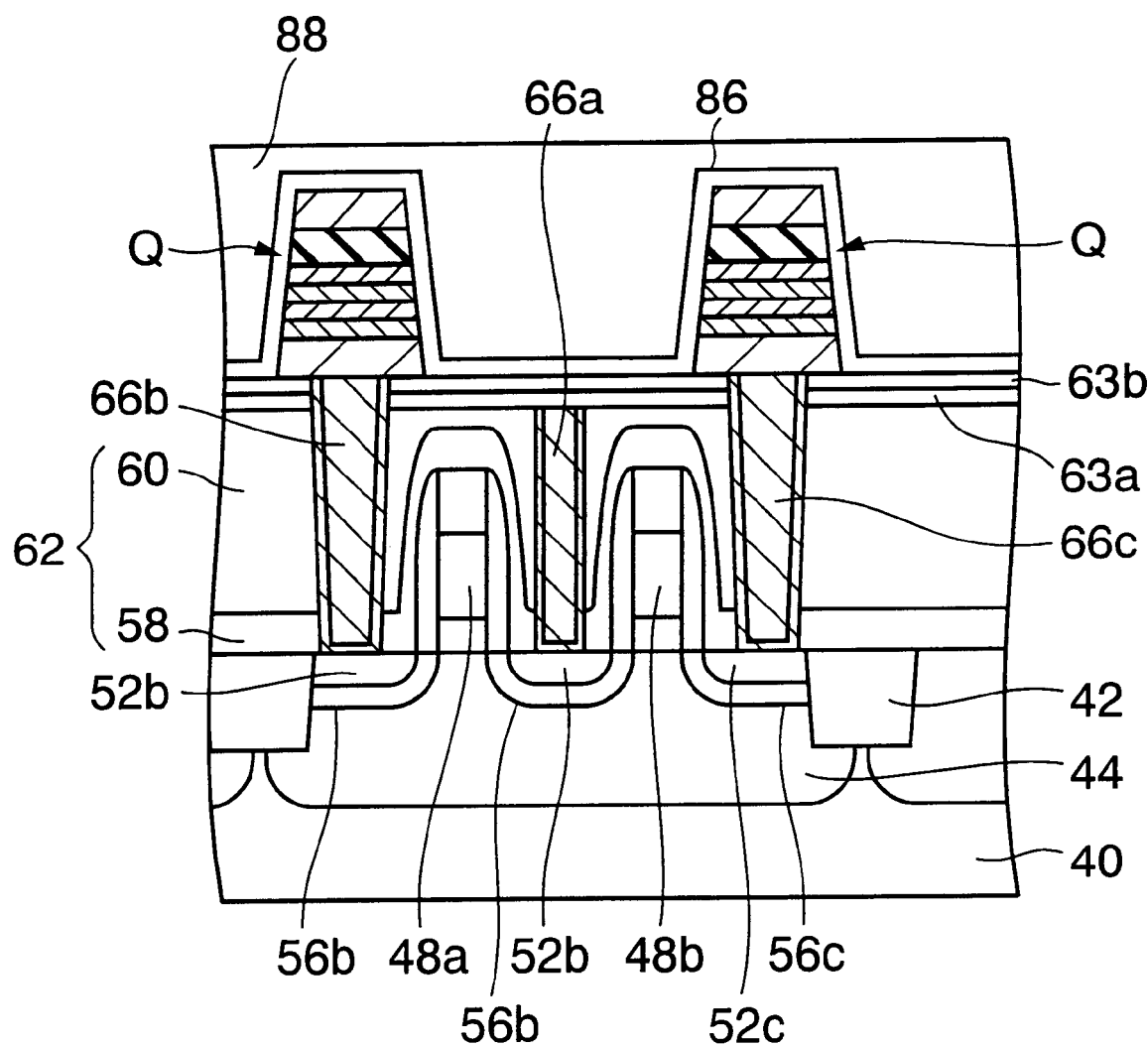

Then, as shown in FIG. 19H, alumina of 50 nm thickness is formed on the substrate by the sputter as the protection layer 86 that covers the capacitor Q. Then, the capacitor Q is annealed at 650° C. for 60 minutes in the oxygen atmosphere. This protection layer 86 protects the capacitor Q from the process damage, and may be formed of PZT.

Then, silicon oxide ($SiO_2$) of about 1.0 $\mu$m thickness is formed as the second interlayer insulating layer 88 on the protection layer 86 by the plasma CVD method using the TEOS gas. In addition, the upper surface of the second interlayer insulating layer 88 is planarized by the CMP method.

Figure 19I:
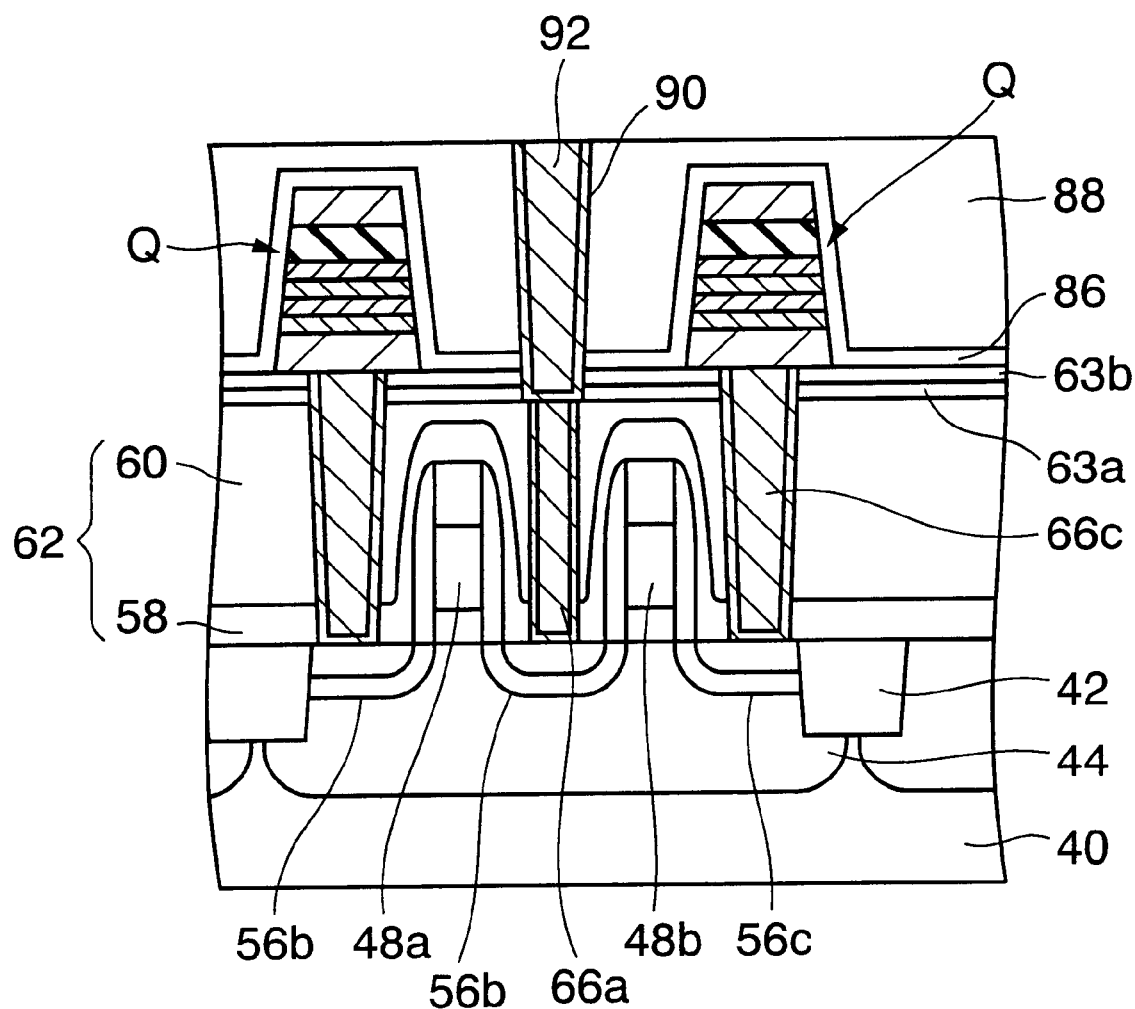

Next, steps required until the structure shown in FIG. 19I is formed will be explained hereunder.

First, the hole 90 is formed on the first conductive plug 66a by etching selectively the second interlayer insulating layer 88, the protection layer 86, the oxidation preventing insulating layer 63a, and the underlying insulating layer 63b while using the resist mask (not shown). After this etching, in order to recover the ferroelectric layer 26 constituting the dielectric layer 32a of the capacitor Q from the damage, the annealing is applied at the substrate temperature of 550° C. for 60 minutes in the oxygen atmosphere, for example.

Then, the TiN layer of 50 nm thickness is formed as the glue layer in the hole 90 and on the second interlayer insulating layer 88 by the sputter method. Then, the W layer is grown on the glue layer by the CVD method and is filled perfectly in the hole 90.

Then, the W layer and the TiN layer are removed from the upper surface of the second interlayer insulating layer 88 by polishing them by the CMP method. Then, the tungsten layer and the glue layer left in the hole 90 are used as the fourth conductive plug 92. This fourth conductive plug 92 is connected electrically to the first impurity diffusion region 56a via the first conductive plug 66a.

Figure 19J:
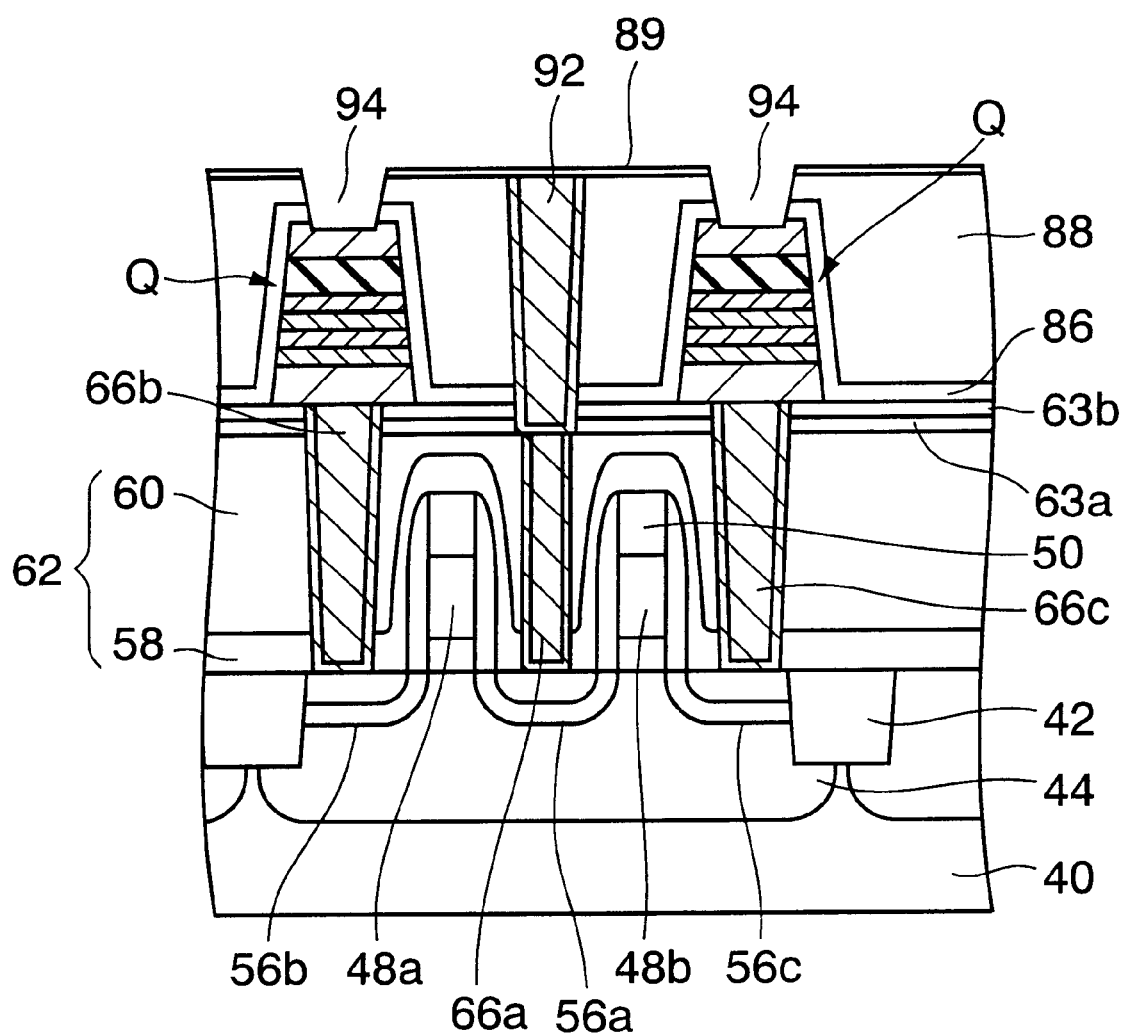

Next, steps required until the structure shown in FIG. 19J is formed will be explained hereunder.

First, the SiON layer is formed as the second oxidation preventing layer 89 on the fourth conductive plug 92 and the second interlayer insulating layer 88 by the CVD method. Then, the contact holes 94 are formed on the upper electrodes 34a of the capacitors Q by patterning the second oxidation preventing layer 89 and the second interlayer insulating layer 88 by virtue of the photolithography method.

The capacitors Q that are damaged by the formation of the contact holes 94 are recovered by the annealing. This annealing is carried out at the substrate temperature of 550° C. for 60 minutes in the oxygen atmosphere, for example.

Then, the second oxidation preventing layer 89 formed on the second interlayer insulating layer 88 is removed by the etching-back and the upper surface of the fourth conductive plug 92 is exposed.

Figure 19K:
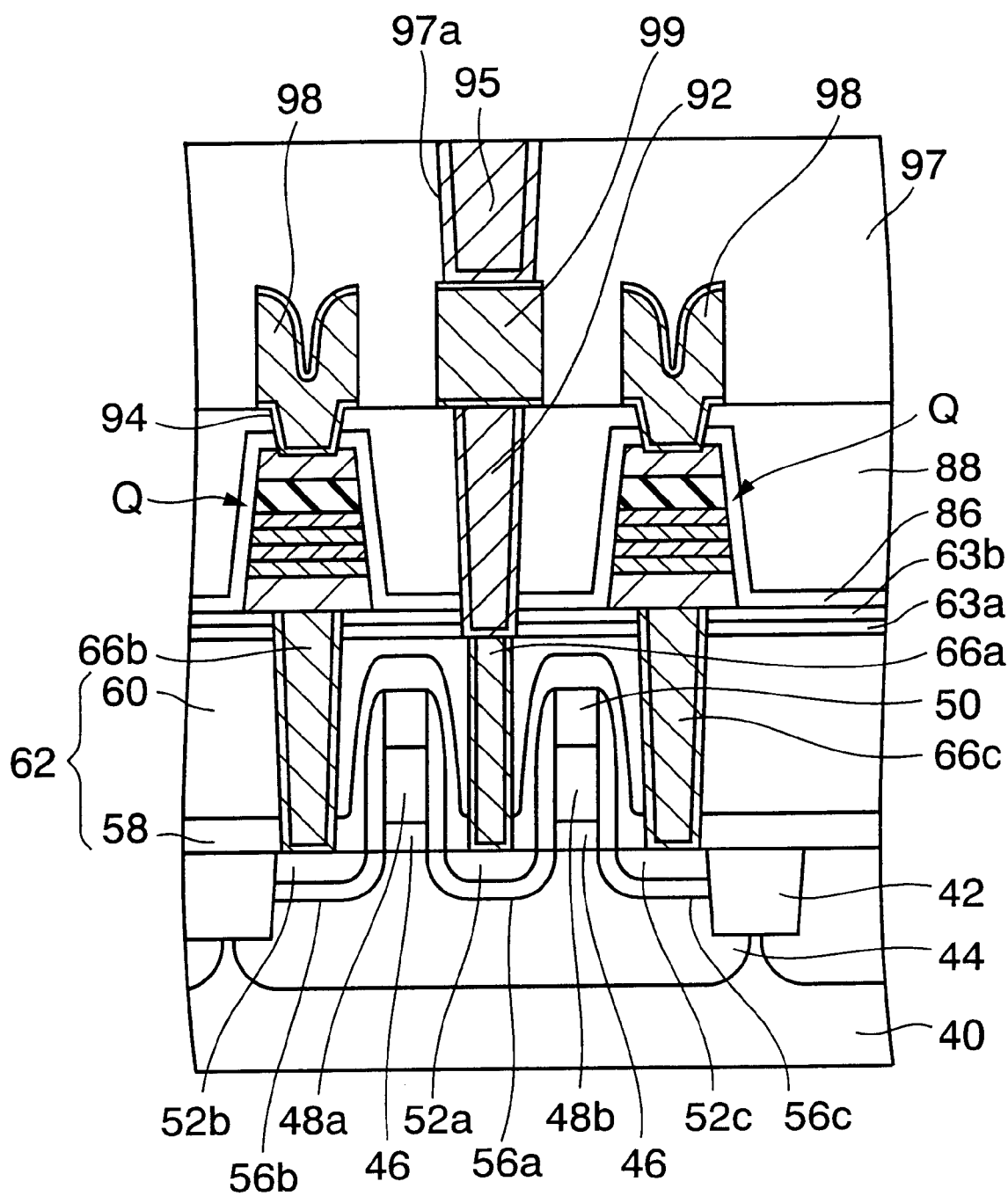

Next, steps required until the sectional structure shown in FIG. 19K is obtain will be explained as follows. A multi-layered metal layer is formed in the contact holes 94 on the upper electrodes 34a of the capacitors Q and on the second interlayer insulating layer 88. Then, the wiring layers 98 made of the multi-layered metal layer, which are connected to the upper electrodes 34a via the contact holes 94, and the conductive pad 99 made of the multi-layered metal layer, which is connected to the fourth conductive plug 92, are formed by patterning the multi-layered metal layer. As the multi-layered metal layer, for example, Ti of 60 nm thickness, TiN of 30 nm thickness, Al—Cu of 400 nm thickness, Ti of 5 nm thickness, and TiN of 70 nm thickness are formed in sequence.

Then, as the method of patterning the multi-layered metal layer, the method of forming the reflection preventing layer on the multi-layered metal layer, then coating the resist on the reflection preventing layer, then exposing/developing the resist to form the resist patterns of the wiring shape, etc., and then executing the etching by using the resist pattern is employed.

In addition, a third interlayer insulating layer 97 is formed on the second interlayer insulating layer 88, the wiring layers 98, and the conductive pad 99. Then, a hole 97a is formed on the conductive pad 99 by patterning the third interlayer insulating layer 97. Then, a fifth conductive plug 95 consisting of the Ti layer and the W layer sequentially from the bottom is formed in the hole 97a.

Then, although not particularly shown, the second wiring containing the bit line is formed on the third interlayer insulating layer 97. The bit line is connected electrically to the first impurity diffusion region 56a via the fifth conductive plug 95, the conductive pad 99, the fourth conductive plug 92, and the first conductive plug 66a. Subsequently, the insulating layer for covering the second wiring layer, etc. are formed, but their details are omitted.

The above steps are steps of forming the FeRAM memory cell region.

The capacitor Q formed by above steps has the lower electrode 30a having the Pt/PtO$_x$/Pt/IrO$_x$/Ir structure. Thus, like the fourth embodiment, the (111) orientation of the uppermost Pt layer 24 in the lower electrode 30a is enhanced and thus the PZT layer 26 formed thereon or other oxide dielectric layer is easily oriented in the (111) direction, so that the layer quality can be improved.

Therefore, like the first embodiment, effects such as the reduction in the leakage current of the capacitor Q and the oxidation prevention of the conductive plugs 66b, 66c immediately under the capacitor Q can be achieved. In addition, the polarization saturation voltage of the capacitor Q can be reduced rather than the capacitor in the first embodiment, the switching electric charge amount of the capacitor Q can be increased rather than the capacitor in the first embodiment, the fatigue loss of the capacitor Q can be reduced rather than the capacitor in the first embodiment, and the retention characteristic can be increased rather than the capacitor in the first embodiment.

In this case, as the capacitor Q constituting the memory cell, the structure shown in FIG. 18 may be employed.

As described in detail, features of the capacitor and the method of manufacturing the same and the semiconductor device according to the present invention are summarized as follows.

As described, according to the present invention, the capacitor is constructed by the lower electrode having the first conductive layer in which the iridium is contained, the second conductive layer which is formed on the first conductive layer and made of the platinum group metal oxide except the iridium, and the third conductive layer which is formed on the second conductive layer and made of the platinum group metal except the iridium, the capacitor dielectric layer formed on the lower electrode, and the upper electrode formed on the capacitor dielectric layer. Therefore, the diffusion of the oxygen into the underlying plug in the course of the layer formation of the capacitor dielectric layer can be prevented by the first conductive layer, and also the diffusion of the iridium from the first conductive layer to the capacitor dielectric layer can be prevented by the second conductive layer.

Therefore, even if the capacitor dielectric layer is formed by the sputtering, the sufficient crystallization of the capacitor dielectric layer can be achieved while preventing the diffusion of the iridium. As a result, the high performance capacitor having the desired electric characteristics can be manufactured.

In addition, according to the present invention, the interface conductive layer made of the platinum group metal except the iridium, e.g., the platinum, is formed between the first conductive layer and the second conductive layer. Therefore, the (111) integrated intensities of the third conductive layer and the overlying ferroelectric layer can be enhanced and thus the electric characteristics of the ferroelectric capacitor can be improved.

What is claimed is:

1. A capacitor comprising:
    a lower electrode having a structure in which a first conductive layer containing a first metal, a second conductive layer that is formed on the first conductive layer and made of a metal oxide of a second metal except iridium or ruthenium different from said first metal, and a third conductive layer formed on said second conductive layer and made of a third metal except iridium or ruthenium different from said first metal, are formed sequentially on an insulating layer;
    a capacitor dielectric layer formed on said lower electrode; and
    an upper electrode formed on said capacitor dielectric layer.

2. A capacitor according to claim 1, wherein said first metal is iridium or ruthenium, said metal oxide of said second metal is a metal oxide of a platinum group metal except iridium and ruthenium, and said third metal is the platinum group metal except iridium and ruthenium.

3. A capacitor according to claim 1, wherein the second metal is a same element as the third metal, and an interface conductive layer made of the second metal is further formed between the first conductive layer and the second conductive layer.

4. A capacitor according to claim 3, wherein the second metal is platinum.

5. A capacitor according to claim 1, wherein the first conductive layer contains iridium or ruthenium and has a function for preventing diffusion of oxygen, and the second conductive layer has a function for preventing diffusion of the iridium or the ruthenium.

6. A capacitor according to claim 1, wherein the second metal is platinum, and the second conductive layer is a platinum oxide layer.

7. A capacitor according to claim 1, wherein the third metal is platinum, and the third conductive layer is a platinum layer.

8. A capacitor according to claim 1, wherein the first conductive layer is a stacked layer in which a first metal layer and a first metal oxide layer are formed sequentially.

9. A capacitor according to claim 8, wherein the first metal layer is an iridium layer and the first metal oxide layer is an iridium oxide layer.

10. A capacitor according to claim 9, wherein an iridium oxide is represented by $IrO_x$ ($0<x<1.2$).

11. A capacitor according to claim 1, wherein the dielectric layer is any one of a ferroelectric layer and a high-dielectric layer.

12. A capacitor according to claim 1, further comprising a substrate, an insulating layer formed above the substrate, and an electrode plug buried in the insulating layer, and wherein the lower electrode is formed on the electrode plug.

13. A semiconductor device comprising:

a transistor formed on a semiconductor substrate, and having a gate electrode and source/drain diffusion layers formed in said semiconductor substrate on both sides of said gate electrode;

an insulating layer for covering said transistor;

an electrode plug buried in said insulating layer and connected electrically to said source/drain diffusion layer; and a capacitor formed on said electrode plug, and having a lower electrode that has a first conductive layer containing iridium or ruthenium, a second conductive layer formed on said first conductive layer and made of a metal oxide of a platinum group metal except iridium or ruthenium and a third conductive layer formed on said second conductive layer and made of a metal of said platinum group except iridium or ruthenium, a capacitor dielectric layer that is formed on said lower electrode by sputtering, and an upper electrode that is formed on said capacitor dielectric layer, and said lower electrode is connected electrically to said electrode plug.

14. A semiconductor device according to claim 13, wherein the second conductive layer is a platinum oxide layer.

15. A semiconductor device according to claim 13, wherein the third conductive layer is a platinum layer.

16. A semiconductor device according to claim 13, wherein the first conductive layer is a stacked layer consisting of an iridium layer and an iridium oxide layer formed on the iridium layer.

17. A semiconductor device according to claim 13, wherein an interface conductive layer made of a metal of a platinum group, that is different from the iridium, is formed between the first conductive layer and the second conductive layer.

18. A semiconductor device according to claim 17, wherein the interface conductive layer is platinum.

19. A semiconductor device comprising:

a transistor formed on a semiconductor substrate, and having a gate electrode and source/drain diffusion layers formed in the semiconductor substrate on both sides of the gate electrode;

an insulating layer for covering said transistor;

an electrode plug buried in said insulating layer and connected electrically to said source/drain diffusion layer; and a capacitor formed on said electrode plug, and having a lower electrode that has a first conductive layer containing iridium or ruthenium for preventing diffusion of oxygen, a second conductive layer formed on said first conductive layer made of a metal of a platinum group except iridium or ruthenium for preventing diffusion of said iridium or ruthenium from said first conductive layer and a third conductive layer formed on said second conductive layer and made of a metal of a platinum group except iridium or ruthenium, a capacitor dielectric layer formed on said lower electrode by sputtering, and an upper electrode formed on said capacitor dielectric layer, and said lower electrode is connected electrically to said electrode plug.

20. A semiconductor device according to claim 19, wherein the second conductive layer is a platinum oxide layer.

21. A semiconductor device according to claim 19, wherein the third conductive layer is a platinum layer.

22. A semiconductor device according to claim 19, wherein the first conductive layer is a stacked layer consisting of an iridium layer and an iridium oxide layer formed on the iridium layer.

23. A semiconductor device according to claim 19, wherein an interface conductive layer made of a metal of a platinum group, that is different from the iridium, is formed between the first conductive layer and the second conductive layer.

24. A semiconductor device according to claim 23, wherein the interface conductive layer is platinum.

25. A capacitor comprising:

a lower electrode having a structure in which a first conductive layer containing a first metal, a second conductive layer formed on said first conductive layer and made of a metal oxide of a second metal except iridium or ruthenium, and a third conductive layer formed on said second conductive layer and made of said second metal, except iridium or ruthenium, are formed sequentially on an insulating layer;

a capacitor dielectric layer formed on said lower electrode; and an upper electrode formed on said capacitor dielectric layer.

* * * * *